(12) United States Patent
Glavish et al.

(10) Patent No.: US 7,989,784 B2
(45) Date of Patent: *Aug. 2, 2011

(54) ION IMPLANTATION APPARATUS AND A METHOD

(75) Inventors: Hilton Glavish, Incline Village, NV (US); Geoffrey Ryding, Manchester, MA (US); Theodore H. Smick, Essex, MA (US); Kenneth Harry Purser, Gloucester, MA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 213 days.

This patent is subject to a terminal disclaimer.

(21) Appl. No.: 12/494,270

(22) Filed: Jun. 30, 2009

(65) Prior Publication Data

US 2010/0327190 A1    Dec. 30, 2010

(51) Int. Cl.
*H01J 37/317* (2006.01)
*H01J 37/20* (2006.01)

(52) U.S. Cl. .......... 250/492.21; 250/492.2; 250/442.11; 250/424; 250/423 R; 250/396 ML

(58) Field of Classification Search ............ 250/492.21, 250/492.2, 442.11, 423 R, 424, 396 ML
See application file for complete search history.

(56) References Cited

U.S. PATENT DOCUMENTS

| | | | |
|---|---|---|---|
| 4,608,513 A | 8/1986 | Thompson | |
| 4,733,091 A * | 3/1988 | Robinson et al. | 250/492.2 |
| 4,831,270 A | 5/1989 | Weisenberger | |
| 4,847,504 A | 7/1989 | Aitken | |
| 5,306,921 A | 4/1994 | Tanaka et al. | |
| 5,350,926 A | 9/1994 | White et al. | |
| 5,374,564 A | 12/1994 | Bruel | |
| 5,389,793 A | 2/1995 | Aitken et al. | |
| 5,753,923 A | 5/1998 | Mera et al. | |
| 5,834,786 A | 11/1998 | White et al. | |
| 6,677,594 B1 * | 1/2004 | Young | 250/442.11 |
| 6,770,888 B1 | 8/2004 | Benveniste et al. | |
| 2002/0139307 A1 | 10/2002 | Ryding et al. | |
| 2010/0327178 A1 * | 12/2010 | Glavish et al. | 250/396 ML |
| 2010/0327181 A1 * | 12/2010 | Ryding et al. | 250/424 |

(Continued)

FOREIGN PATENT DOCUMENTS

WO    2004/114356    12/2004

OTHER PUBLICATIONS

International Search Report and Written Opinion dated Dec. 9, 2010 for PCT/US2010/039191.

(Continued)

*Primary Examiner* — Nikita Wells

(57) ABSTRACT

A hydrogen ion implanter for the exfoliation of silicon from silicon wafers uses a large scan wheel carrying 50+ wafers around its periphery and rotating about an axis. In one embodiment, the axis of rotation of the wheel is fixed and a ribbon beam of hydrogen ions is directed down on a peripheral edge of the wheel. The ribbon beam extends over the full radial width of wafers on the wheel. The beam is generated by an ion source providing an extracted ribbon beam having at least 100 mm major cross-sectional diameter. The ribbon beam may be passed through a 90° bending magnet which bends the beam in the plane of the ribbon. The magnet provides intensity correction across the ribbon to compensate for the dependency on the radial distance from the wheel axis of the speed at which parts of the wafers pass through the ribbon beam.

27 Claims, 15 Drawing Sheets

U.S. PATENT DOCUMENTS

2010/0327189 A1* 12/2010 Ryding et al. ........... 250/492.21

OTHER PUBLICATIONS

Ziegler, J. F., ed., Ion Implementation—Science and Technology, Annapolis, MD: Ion Implantation Technology, Co., 2004, pp. ii, iv-vi, 1-1 to 1-43, 2-1 to 2-42, 3-1 to 3-30, 7-1 to 7-38, 8-1 to 8-40, 9-1 to 9-33, 11-0 to 11-28, 12-1 to 12-40, 13-1 to 13-19, and 14-1 to 14-37.

Ziegler, J. F., ed., Ion Implementation—Science and Technology, Poughkeepsie, NY: Ion Implantation Technology, Co., 1996, pp. ii-v, 391-427, and 442-510.

H.A. Enge, Focusing of Charged Particles vol. II, ed. A Septier, Academic Press, 1962, p. 214-217, New York, USA.

Pierre, Donald A., Optimization Theory with Applications, 1986, p. 274-277, 320-323,& 354-355, Dover Publications, Inc., New York, USA.

U.S. Appl. No. 12/122,108, filed May 16, 2008, entitled "Ion Implanter for Photovoltaic Cell Fabrication".

Notice of Allowance dated Mar. 29, 2011 for U.S. Appl. No. 12/494,272.

Office Action dated Apr. 22, 2011 for U.S. Appl. No. 12/494,268.

* cited by examiner

ION IMPLANTATION APPARATUS AND A METHOD

RELATED APPLICATIONS

This application is related to Smick et al., U.S. patent application Ser. No. 12/494,268 filed on Jun. 30, 2009, "Ion Implantation Apparatus and Method for Fluid Cooling,", Glavish et al., U.S. patent application Ser. No. 12/494,272 filed on Jun. 30, 2009, "Ion Source Assembly for Ion Implantation Apparatus and a Method of Generating Ions Therein,", Ryding et al., U.S. patent application Ser. No. 12/494,269 filed on Jun. 30, 2009, "Ion Implantation Apparatus," each filed on even date herewith, owned by the assignee of the present application, and hereby incorporated by reference.

BACKGROUND

1. Field of the Invention

This invention relates to ion implantation apparatus to implant ions into planar workpieces. Specific applications of the ion implantation apparatus include the production of lamina of crystalline semiconductor material, such as silicon. Such silicon laminae may be used for the production of photovoltaic cells.

2. Background information

As the demand for renewable energy based on renewable sources increases, the implementation of photovoltaic technology has expanded dramatically in recent years. Nevertheless, a way of forming crystalline silicon bodies optimized for photovoltaic cells has remained elusive.

Crystalline silicon wafers adapted to bear photovoltaic cells are conventionally obtained by slicing a silicon ingot. This process, which typically yields a silicon wafer thicker than 150 μm, wastes a substantial amount of silicon by consuming up to 50% of the silicon body in kerf loss and delivering a much greater thickness than is needed for useful photovoltaic devices.

Thinner silicon laminae have been made by exfoliation of a film by heating after high-dose ion implantation. The films produced this way have found application in forming silicon-on-insulator structures but have been cost-prohibitive for solar cells. Also at thickness well under 1 μm, the films may be so thin as to make efficient light-capturing difficult. Boosting the energy of ion implant could increase the film thickness, but this adaptation would make the films even more expensive and less economical for photovoltaic cells.

There is accordingly, a need for a cost-effective way to form silicon bodies optimized for photovoltaic applications.

A known type of ion implantation tool has an ion source which produces a beam containing ions to be implanted. The ion beam is directed through a region of homogeneous magnetic field in an ion filter to provide spatial separation between ions in the beam with different momentum over charge (mv/e) ratios. A mass selector slit blocks any unwanted ions and allows desired ions to pass, optionally through an electrostatic accelerator, to a process chamber for implantation in semiconductor substrates or wafers. To improve productivity, a batch of wafers may be processed simultaneously by mounting them round the periphery of a process wheel mounted for rotation about an axis, so that the wafers on the wheel pass one after the other through the ion beam. The process wheel axis is at the same time translated towards and away from the beam to provide a two dimensional mechanical scan of the wafers through the ion beam, to ensure all parts of the wafers are implanted, even though the ion beam may have a cross sectional area as it strikes the wafers which is smaller than the wafer area.

One known batch implanter, which is a variant of the above general type, has a large process wheel with a fixed vertical axis and a radially scanned ion beam.

A further known type of implantation tool produces a so-called ribbon beam of ions, having a major dimension sufficient to extend right across a single wafer. A ribbon beam arrangement of this kind requires the wafers to be mechanically scanned only in one dimension, transverse to the ribbon beam plane. This is usually accomplished with a translational scanning holder carrying a single wafer, so that wafers are implanted serially one at a time. A magnetic mass selecting ion filter is used to bend the ribbon beam transversely to the plane of the ribbon beam, so that desired ions from the ribbon beam can be selected by a relatively narrow slit extending parallel to the ribbon beam plane. Alternatively, if the ion beam is bent in the plane of the ribbon, the ribbon is brought to a focus in the x-direction (the ribbon plane), to pass through a narrow mass selection slit, before being expanded again and collimated into a ribbon beam.

BRIEF SUMMARY OF THE INVENTION

One aspect of the invention provides ion implantation apparatus for performing an ion implantation process to implant ions into multiple planar workpieces, the apparatus comprising a workpiece support wheel mounted for rotation about an axis which is translationally fixed during a said implantation process, said support wheel having a plurality of workpiece supports distributed at a common radius around a periphery of the wheel, and an ion beam generator which is arranged to form, during said implantation process, a non-scanning beam of ions for implanting, said beam being directed along a beam path to an implant location on said wheel periphery, whereby workpieces on said supports are passed successively through said implant location along a circular scan path by rotation of said wheel, said workpieces each having a predetermined linear dimension in a plane of the workpiece, said predetermined linear dimension extending normal to said scan path when the workpieces are mounted on said supports, said ion beam generator being adapted such that at said implant location, the beam of ions has a cross-sectional dimension normal to said scan path which is at least 100 mm and sufficient to implant ions over the full extent of said predetermined linear dimension of said workpieces on said supports.

Said ion beam generator may be further adapted such that, at said implant location, said beam of ions has a pre-determined non-uniform intensity along said cross-sectional dimension, said pre-determined non-uniform intensity being proportional to R, where R is the radial position along said cross-sectional dimension relative to said axis of the support wheel.

In an embodiment, the ion beam generator includes an ion source having an ion extraction slit to generate a ribbon beam of ions including ions to be implanted, said ribbon beam having major and minor orthogonal cross-sectional dimensions; and a magnetic ion filter to bend said ribbon beam in a beam plane containing said beam and parallel to said major dimension so that said ions to be implanted are directed in the ribbon beam along the beam path towards said implant location.

The magnetic ion filter may be arranged to focus ions of the ribbon beam in the minor dimension of the ribbon beam to produce a conjugate ion optical image in said minor dimension of an ion optical object at said ion source, said conjugate image extending across the ribbon beam substantially perpendicularly to said beam path.

In a further embodiment, the ribbon beam from the ion source which is input to said magnetic ion filter is substantially parallel over the major cross-sectional dimension of the ribbon and said magnetic ion filter is arranged such that an output beam from said magnetic ion filter is also substantially parallel over said major dimension of the ribbon.

Then, said magnetic ion filter may be arranged to produce a bend in the ribbon beam between said input and output beams of at least 75°, more particularly about 90°.

In a further embodiment, said magnetic ion filter comprises at least one region with homogeneous magnetic field normal to said beam plane, and provides a sufficient bend in the ribbon beam to spatially resolve from desired beam ions, non-desired ions having mv/e values a factor of $\sqrt{2}$ or more, higher or lower, than the desired ions.

In another embodiment, said magnetic ion filter is arranged to redistribute ions over said major dimension of the ribbon beam to provide a predetermined non-uniform intensity of ions in the ribbon beam directed towards said implant locaton, said predetermined non-uniform intensity being proportional to R, where R is the radial position along said cross-sectional dimension relative to said axis of the support wheel.

In a still further embodiment, said magnetic ion filter comprises an assembly having a flight tube defining an ion beam passage through the filter for desired ions, said beam passage having first and second cross-sectional dimensions extending respectively in first and second orthogonal directions, said first cross-sectional dimension being greater than said second cross-sectional dimension to accommodate a ribbon-shaped ion beam extending in a ribbon plane parallel to said first orthogonal direction, and a magnet assembly to provide a magnetic field extending in said second direction across said beam passage to deflect ions in a ribbon beam passing through said flight tube in said ribbon plane, wherein said magnet assembly has first and second pairs of opposed magnetic pole pieces spaced apart along said ion beam passage, said pairs providing respective magnetic fields with a common polarity across the beam passage, each of said first and second pairs of opposed pole pieces having, with respect to an ion beam direction through said beam passage, a respective predetermined leading edge profile and a respective predetermined trailing edge profile.

Then, said leading and trailing edge profiles of said first and second pairs of magnetic pole pieces may be shaped to apply a predetermined redistribution of ions over said major dimension of the ribbon beam to provide a predetermined non-uniform intensity of ions in an output ribbon beam from said magnetic filter, said predetermined non-uniform intensity being proportional to R, where R is the radial position along said cross-sectional dimension relative to said axis of the support wheel.

Said leading and trailing edges may be further adapted to focus ions of the ribbon beam in the minor dimension of the ribbon beam to produce a conjugate ion optical image in said minor dimension of an ion optical object at said ion source, said conjugate image extending across the ribbon beam substantially perpendicularly to said beam path.

In another aspect, the invention provides a magnetic ion filter assembly for ion implantation apparatus comprising a flight tube defining an ion beam passage through the filter of desired ions, said beam passage having first and second cross-sectional dimensions extending respectively in first and second orthogonal directions, said first cross-sectional dimension being greater than said second cross-sectional dimension to accommodate a ribbon-shaped ion beam having major and minor cross-sectional dimensions and extending in a ribbon plane parallel to said first orthogonal direction, and a magnet assembly to provide a magnetic field extending in said second direction across said beam passage to deflect ions in a ribbon beam passing through said flight tube in said ribbon plane, wherein said magnet assembly has first and second pairs of opposed magnetic pole pieces spaced apart along said ion beam passage and said pairs providing respective magnetic fields with a common polarity across the beam passage, each of said first and second pairs of opposed pole pieces having, with respect to an ion beam direction through said beam passage, a respective predetermined leading edge profile and a respective predetermined trailing edge profile.

In a further aspect, the invention provides a method of implanting ions into multiple planar workpieces comprising the steps of mounting the workpieces on workpiece supports distributed at a common radius around the periphery of a workpiece support wheel; rotating said support wheel around a translationally fixed axis whereby the workpieces are passed along a circular scan path successively through an implant location; generating a non-scanning ribbon-shaped beam of ions to be implanted and directing said ribbon beam to said implant location so that a major cross-sectional dimension of the ribbon beam extends in a direction normal to said scan path completely across workpieces passing through said implant location.

BRIEF DESCRIPTION OF THE DRAWINGS

Examples of the invention will be described below with reference to the accompanying drawings, in which;

FIG. 6b is a sectional view of the mounting block taken along line B-B of FIG. 6a.

DETAILED DESCRIPTION OF THE INVENTION

Figure 1:
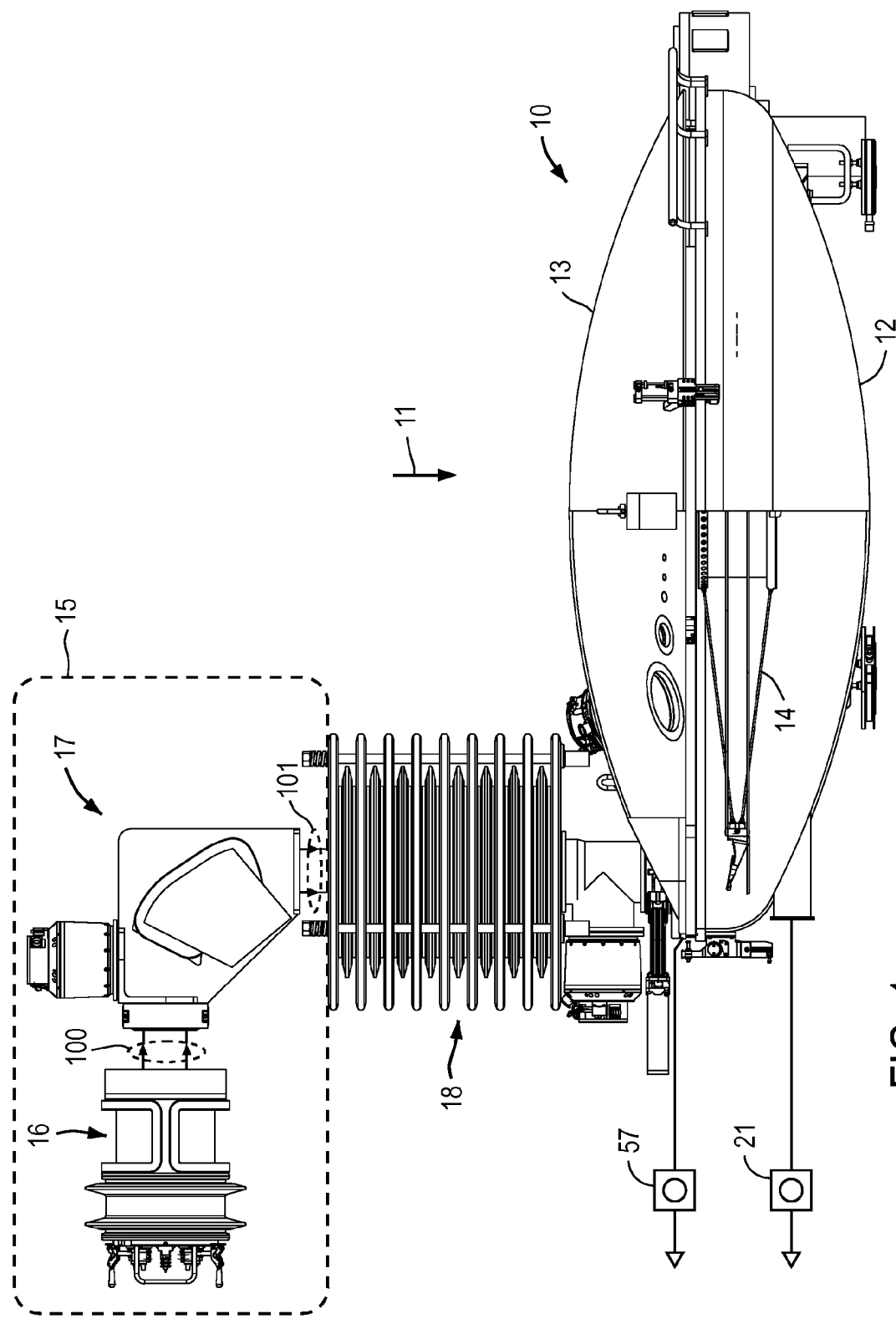
FIG. 1 is a schematic view in elevation and partially cut away, of an ion implanter embodying the present invention.

FIG. 1 is a schematic illustration of ion implantation apparatus which is an embodiment of the present invention. Ion implantation is conducted in a vacuum environment and the main operative features of the embodiment are contained within a vacuum chamber. In the illustrated embodiment in FIG. 1, the vacuum chamber is shown in three interconnected parts. The first part is a process chamber 10 which has a circular profile when viewed from above in FIG. 1 along the direction of arrow 11. The process chamber 10 comprising a part spherical lower wall section 12 and an opposed part spherical upper wall section 13, forming a disc shaped vacuum enclosure which is thickened at the center of the disc. This process chamber 10 contains a process wheel 14 extending in the plane of the disc chamber 10 for rotation about a vertical axis aligned substantially with the center of the disc. Substrates for processing are carried in the process chamber 10 about the periphery of the wheel 14, as will be described and illustrated later in greater detail.

A second part of the vacuum chamber is contained in a high voltage enclosure 15 and is constituted by an ion source structure 16 and a mass selection magnet structure 17. A beam of ions desired for implantation (in one embodiment, $H^+$ ions) is produced in the ion source structure 16 and directed into the magnet structure 17. The magnet structure 17 is effective to bend the ion beam, allowing unwanted ions in the beam to be filtered from the continuing beam which is directed towards the process chamber 10. The ion source and mass selection structures 16 and 17 will be described in greater detail later herein.

A third part of the vacuum chamber is constituted by an accelerator tube 18 which interconnects the high voltage part of the vacuum chamber within the high voltage enclosure 15 and the process chamber 10. The accelerator tube 18 comprises an electrically insulating element to allow the ion source and mass selection structures 16 and 17 to be held at a very high voltage relative to the process chamber 10. Electrodes contained in the accelerator tube are electrostatically biased to accelerate the ion beam directed from the mass selection structure 17 to the required implant energy for delivery to the process chamber 10. All parts of the vacuum chamber are pumped down by one or more vacuum pumps, one of which is shown schematically in FIG. 1 at 21.

Figure 2:
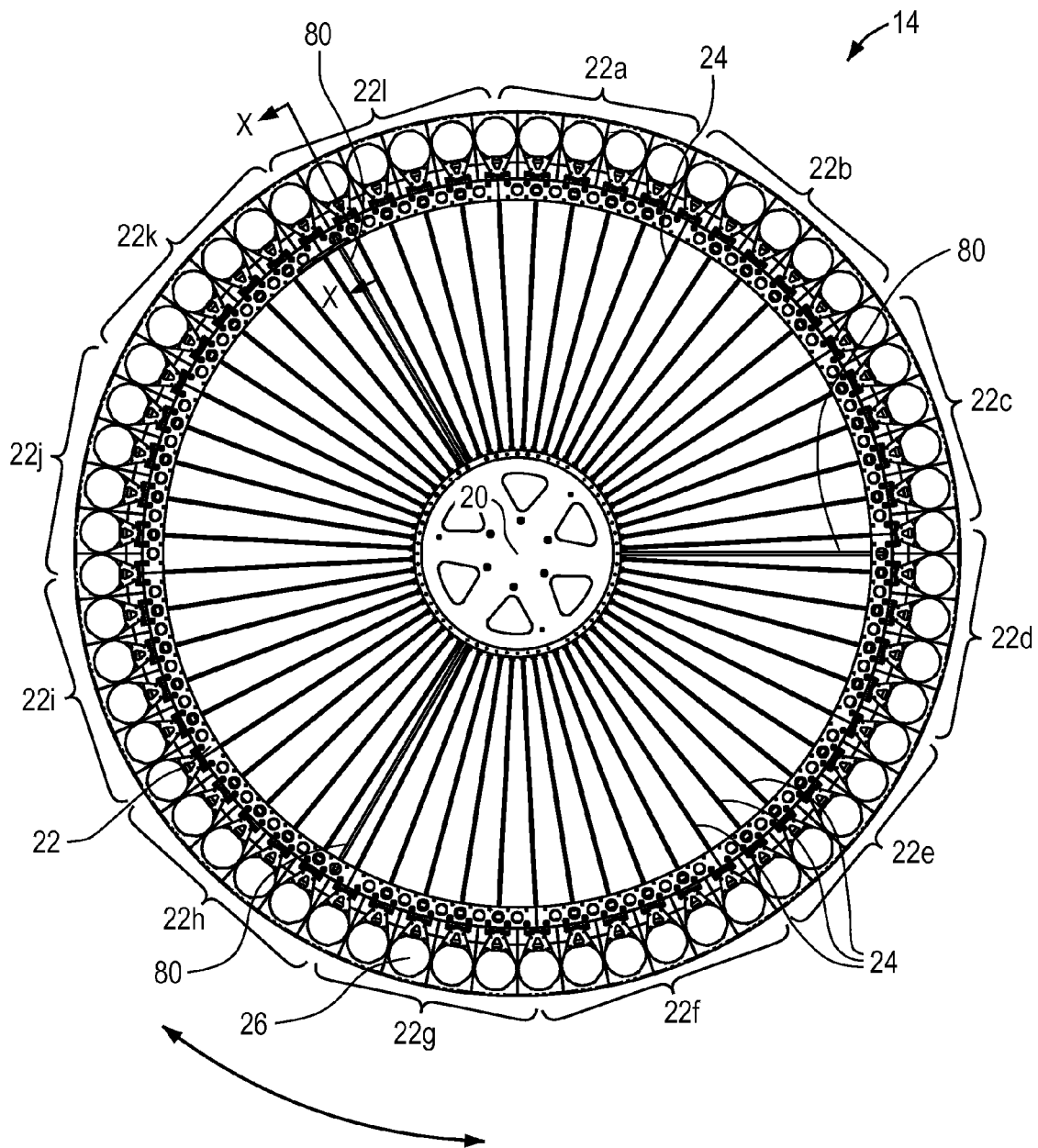
FIG. 2 is a plan view of the implant wheel of the ion implanter of FIG. 1.

Turning now to FIG. 2, a plan view of the process wheel 14 is shown. The process wheel comprises a hub 20 and a rim 22 connected to the hub 20 via a plurality of spokes 24. The rim 22 is formed as a plurality (twelve in this embodiment) of segments 22a, 22b . . . 22l each of which form, in the embodiment of FIG. 2, a 30° arc of the rim.

Each segment of the rim 22 in turn carries a plurality of equidistantly spaced substrate supports 26, extending radially outwardly from the rim segments. The process wheel 14 of FIG. 2 thus carries 60 substrate supports 26 around the rim 22. Each of the supports 26 provides a wafer support surface which is shaped and sized to match the wafer to be processed. Importantly, if the wafer to be processed is a 150 mm circular wafer, the support surfaces of the supports 26 are made of similar size and shape and the diameter of the process wheel is such as to provide a peripheral circumference of at least 60×150 cm so that the 60 supports (and 60 wafers on the supports) are accommodated around the wheel periphery without overlapping. Instead of 150 cm circular supports, other shapes and sizes may be provided to accommodate other wafer shapes and sizes, but in each case, the process wheel is formed with a peripheral circumference of at least N*a where N is the number of wafer supports and a is the smallest width of the wafers to be processed. If the wafers are circular, a is the diameter.

An important characteristic of the embodiment is that there are at least 50 (60 in this example) wafer supports 26 on the process wheel and the ion source and mass selection magnet structures 16 and 17 in combination with the accelerator tube 18 provide an ion beam directed at wafers on the support surfaces 26 of the process wheel which has an energy of at least 200 keV and an ion current of at least 50 mA. Then the power delivered to wafers by the beam is at least 10 kW. By ensuring the process wheel can accommodate at least 50 wafers at the same time, spinning the wheel during processing allows this beam power to be shared between the wafers on the wheel so that each wafer receives only as much power as can be dissipated or removed without overheating and damaging the wafer.

Figure 4:
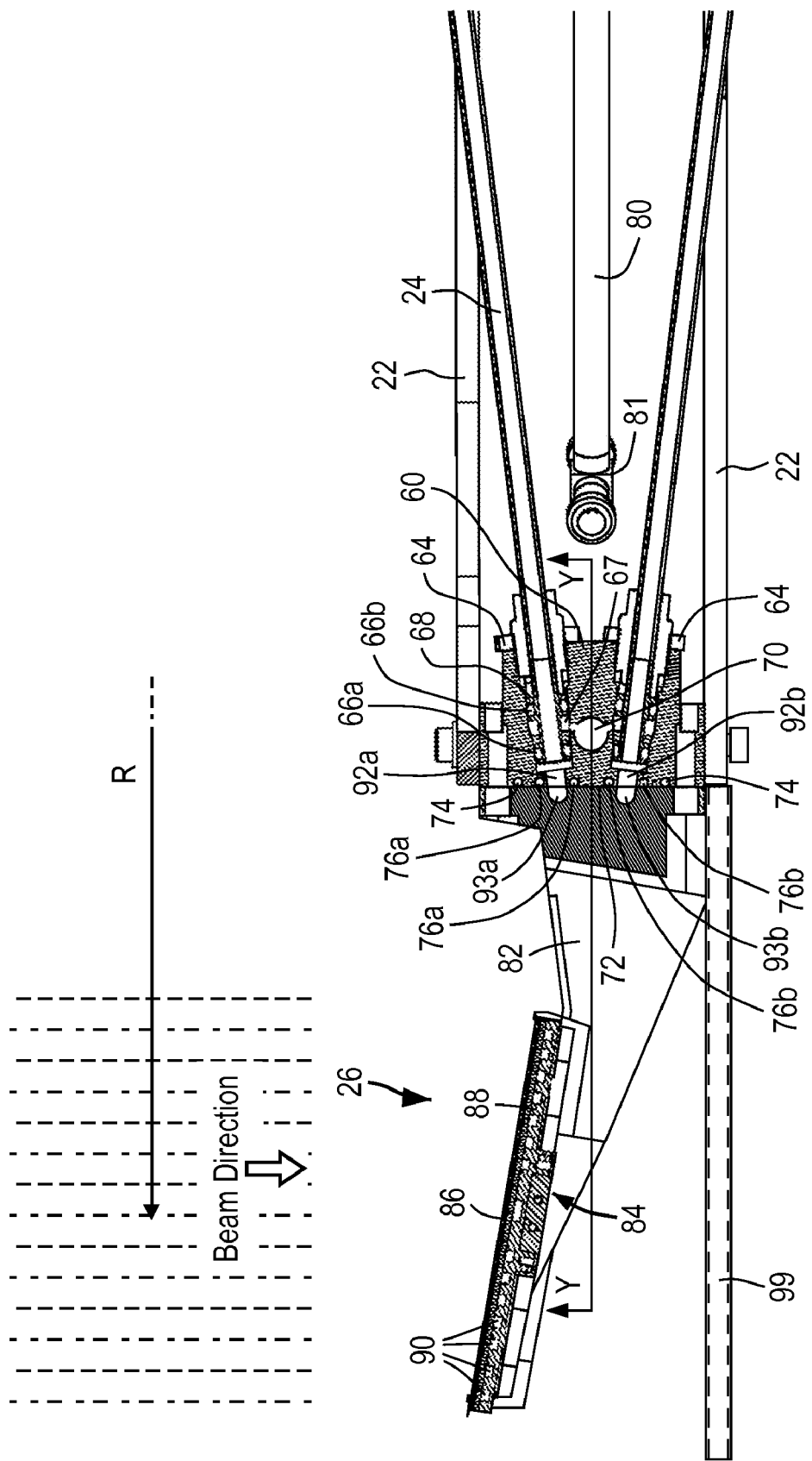
FIG. 4 is a view in elevation and in section of the rim of the implant wheel together with a substrate holder mounted thereon.

Referring again to FIG. 2, the spokes 24 may have a dual purpose. Firstly they extend between the hub 20 and the rim 22 under tension (which tension may be adjusted in the manner of a bicycle wheel, as detailed below). By holding the spokes 24 under tension, the 12 segments 22a-22l of the rim 22 are drawn towards the hub 20 and compress together circumferentially. Thus the rim 22 is stiffened rotationally by the tension in the spokes 24. Note that, in the embodiment, the spokes 24 are equally spaced around both the hub 20 and rim 22, and, are aligned radially. Axial rigidity between the hub and rim is provided by tensioning the spokes 24 along lines forming an acute angle to the plane of the process wheel 14, as is best seen in FIG. 4 described below. If it is desired to increase the rotational stiffness of the process wheel 14, then stiffener plates may be employed. Instead, bracing bars may be provided extending non-radially between the hub 20 and the rim 22. A symmetrical arrangement of six such bars can be tensioned to provide tortional stiffness in both rotational directions. In another embodiment, tortional stiffness is provided by non-radial alignment of the spokes 24 to form an interlaced pattern in the fashion of a wire-spoked bicycle wheel.

The second possible purpose of the spokes is to channel cooling fluid from outside of the disc shaped vacuum enclosure, via the hub 20, to the rim 22. Cooling fluid at the rim is then channeled to each substrate support 26 in turn so as to provide cooling for wafers mounted on the substrate supports 26, during implantation.

Figure 3:
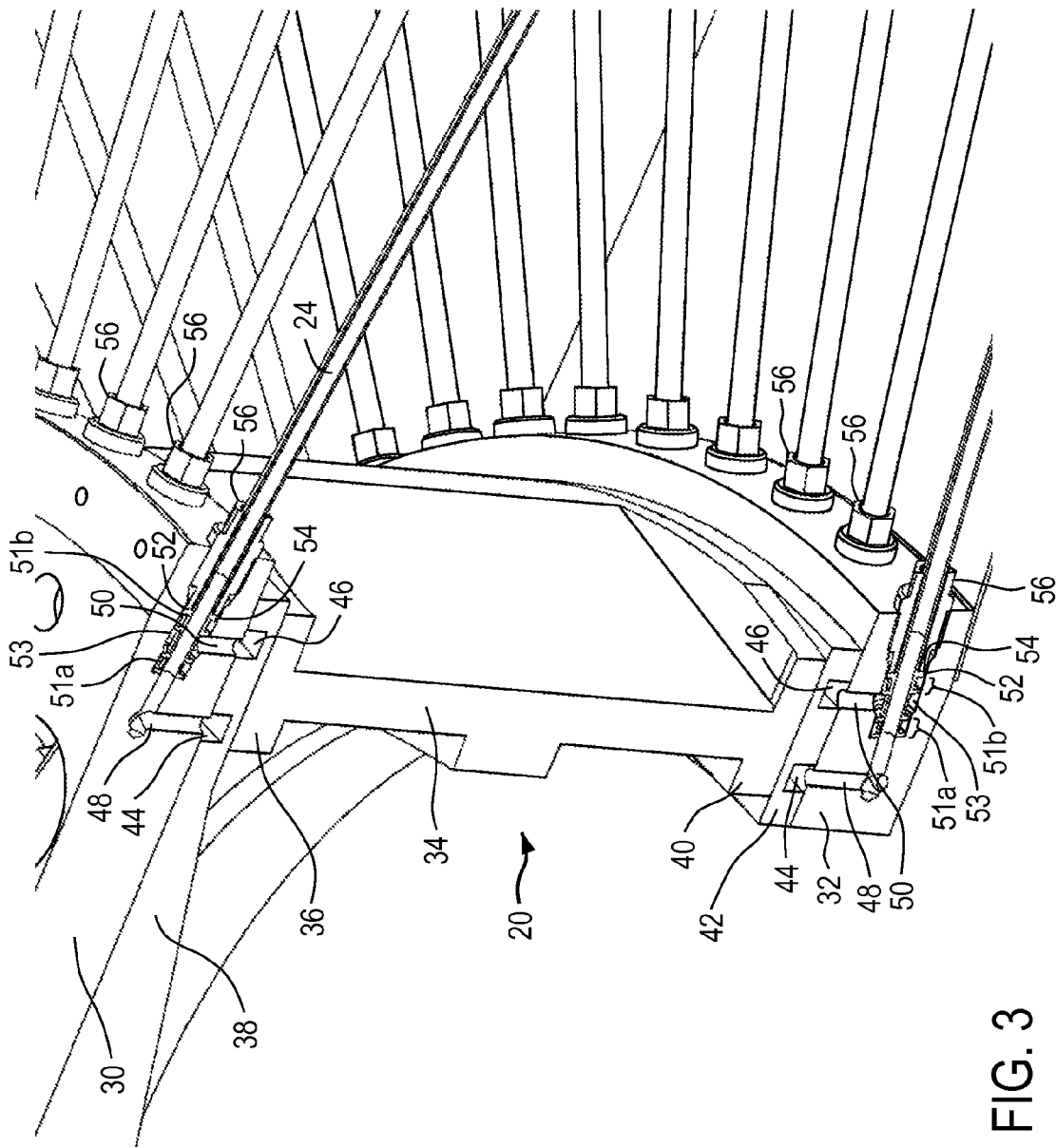
FIG. 3 is an enlarged perspective view, partially in section, of the hub of the implant wheel.

FIG. 3 shows, in partial cutaway, a third angle projection detailing the hub 20. The hub comprises an upper slotted disc 30 and a lower annulus 32, separated and supported by a web 34 to form a generally right cylinder. An upper edge of the web 34 is formed with an upper flange 36 and an upper manifold 38 is sandwiched between that upper flange 36 of the web 34, and the flat face of the upper slotted disc 30. Likewise the lower edge of the web 34 is formed with a lower flange 40, and a lower manifold 42 is sandwiched between the lower flange 40 and the lower annulus 32.

Extending circumferentially around the surface of the upper manifold 38 are first and second circular upper channels 44, 46, which are each 'U'-shaped in section in this example. The centers of both circles each coincide with the axis of rotation of the process wheel 14 passing through the center of the hub 20, but the first upper channel 44 is radially spaced (has a different circle diameter) from the second upper channel 46. Both channels 44, 46 are formed adjacent the outside edge of the upper manifold. The open faces of these channels register with corresponding internal passages 48, 50 formed within the upper slotted disc 30. The internal passage 48 in turn registers with the open end of each spoke 24 which inserts through an opening in the outer circumferential wall of the hub 20.

In order to create a fluid seal for each spoke 24 to the hub 20, and to allow each spoke 24 to be tensioned, each spoke is formed with a pair of U-section 'o' ring seats 51a, 51b that comprise pairs of radial ribs around the end of the spokes 24. In use, elastomer 'o' rings may be seated between each pair of ribs 51a and 51b, but these are omitted in the drawings for clarity. The "o" rings in their respective seats form a tandem pair of piston seals between the spoke and interior cylindrical surfaces of the opening in the hub receiving the end of the spoke.

That face of the 'o' ring seat rib which is formed furthest away from the end of the spoke acts as a spoke flange 52 with a bearing surface that engages with a radially inward face 54 of a corresponding tensioner boss 56. The tensioner boss 56 has a thread (not visible in FIG. 3) formed on its shank. The thread on the shank of each tensioner boss 56 cooperates with a corresponding thread formed on the inside of the respective opening in the outer circumferential wall of the hub 20.

In use, to place the spokes 24 under tension, each tensioner boss 56 is rotated clockwise so that it screws into the corresponding threaded opening in the hub 20. This causes the rear face 54 of the tensioner boss 56 to engage against the spoke flange 52 formed by the outer face of the 'o' ring seat 51b, and to draw the end of the spoke 24 into the hub 20. Adjustment of the tension of multiple spokes 24 may be carried out in known fashion to ensure uniformity of circumferential compression around the rim 22.

An intermediate chamber 53 is formed between the two 'o' ring seals formed by seats 51a, 51b. The chamber 53 is connected via the second internal passage 50 to the second 'U' shaped upper channel 46. This channel 46 is in turn pumped by an auxiliary vacuum pump external to the vacuum chamber (which pump is shown schematically at 57 in the FIG. 1) so as to create a vacuum in the intermediate chamber 53. The purpose of this is to provide a safety enclosure arrangement, by differentially pumping so as to avoid cooling water which is pumped around the process chamber 10 at about 40 psi (275 kPa) leaking past the 'o' rings in seats 51a, 51b and into the process chamber 10 which may be held under a vacuum of about $10^{-4}$ Pascal.

A similar arrangement is employed to capture and tension spokes 24 within the lower annulus 32 of the hub 20; each spoke has a pair of 'o' ring seats, and the outer face of the 'o' ring seat furthest from the end of the spoke provides a bearing surface 52 that engages a rear face of a corresponding tensioner boss 56. This has exterior threading to engage with a thread in an aperture formed in the outer wall of the lower annulus 32.

The spokes 24 that insert into the upper slotted disc 30 carry cooling fluid between the hub and the rim in a first direction (e.g., hub to rim), while the spokes that insert into the lower annulus 32 carry cooling fluid between the hub 20 and rim 22 in the opposite direction (e.g., rim to hub). As will be detailed below, this allows cooled fluid to be channeled from outside the process chamber 10, via the hub 20, to the rim (along the upper spokes, for example) and from there to the substrate supports 26, where heat caused by ion implantation into wafers upon the substrate supports is conducted into the cooling fluid. Then the (heated) cooling fluid is taken away via the (lower) spokes (in this example), back to the hub and then away from the process chamber 10 to be recycled or discarded.

The manner in which (stationary) cooling fluid supply and return lines (not shown in the Figures) are connected to the hub 20, which of course rotates in use, does not form a part of the present invention and thus is not described. Such techniques for passing fluids between stationary and rotating objects are well known in the art. It will be noted that the channels 44, 46 in the upper and lower manifolds 38, 42 extend around the circumference of the hub 20 so as to form a fluid channel common to all 60 of the spokes 24.

Turning now to FIG. 4, a section through the process wheel 14 along the line X-X of FIG. 2 is shown. This represents a close-up section through the rim 22 of the process wheel 14 and the substrate support 26.

The rim 22 is formed as segments 22a . . . 22l of an annulus, as is best seen in FIG. 2, and provides mechanical support for the spokes 24. Extending around the circumference of the rim 22 is a plurality of mounting blocks 60. Each mounting block 60 is affixed at an upper and lower surface to the rim 22. This may be best seen in FIG. 5, which shows a perspective view of mounting blocks 60 cut away along a mid plane as indicated by line Y-Y in FIG. 4. Each mounting block 60 is generally rectilinear with a major axis extending in the circumferential direction of the rim 22. Each mounting block 60 is, however, spaced circumferentially from adjacent mounting blocks: that is, the major axis of each block 60 is shorter than 360/N, where N is the number of substrate supports (60 in the example of FIG. 2). As seen in FIG. 4, each mounting block 60 is affixed to one (or across two, as in FIG. 5) of the segments 22a . . . 22l of the rim 22 using screws 62a, 62b. Alternatively, the mounting blocks 60 could be welded to the rim segments 22a . . . 22l.

Each mounting block 60 serves a number of purposes. Firstly, it provides on a first, radially inwardly directed face, a pair of threaded apertures into which corresponding tensioner bosses 64 are screwed in use. As with the tensioner bosses 56 that hold the spokes 24 into the hub 20 under tension, the tensioner bosses 64 inserted into the mounting block 60 each have an axially extending hole through their center to receive the ends of the spokes 24. Again as with the hub end of the spokes, the rim end of the spokes 24 is provided with first and second 'o' ring seal seats 66a, 66b formed as pairs of radial ribs around the circumference of the spoke. The 'o' rings in these seats 66a, 66b (again omitted in the drawings for clarity) provide fluid sealing between the spoke 24 and the mounting block 60, in the form of piston seals.

A radially inner face 68 of the radially inner rib of 'o' ring seat 66b abuts against the radially outwardly directed face of the tensioner boss 64. Thus, clockwise screwing of the tensioner boss 64 moves the tensioner boss 64 into the threaded aperture in which it sits and, in turn, increases the tension on the spoke 24 by engaging against the face 68 and pressing it radially outwardly away from the hub 20.

Figure 5:
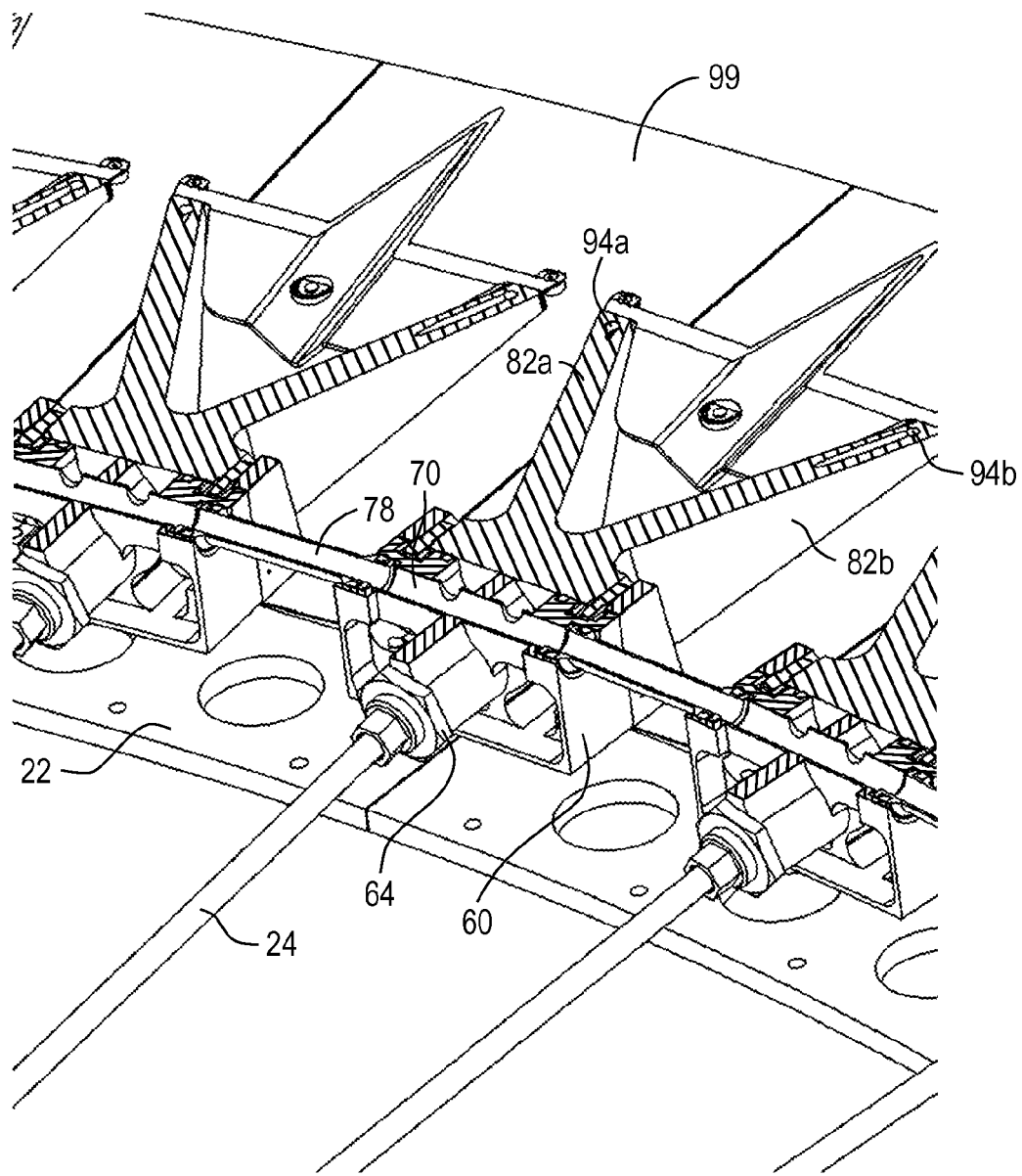
FIG. 5 is an enlarged perspective view of part of the wheel rim, taken in section along line Y-Y in FIG. 4.

The 'o' rings in seats 66a, 66b form between them in use a respective intermediate chamber 67 which is connected to a plenum channel 70 running circumferentially through each mounting block 60. As best seen in FIG. 5, these plenum channels are interconnected between adjacent blocks 60 around the circumference of the rim by pipe sections 78.

Figure 6B:
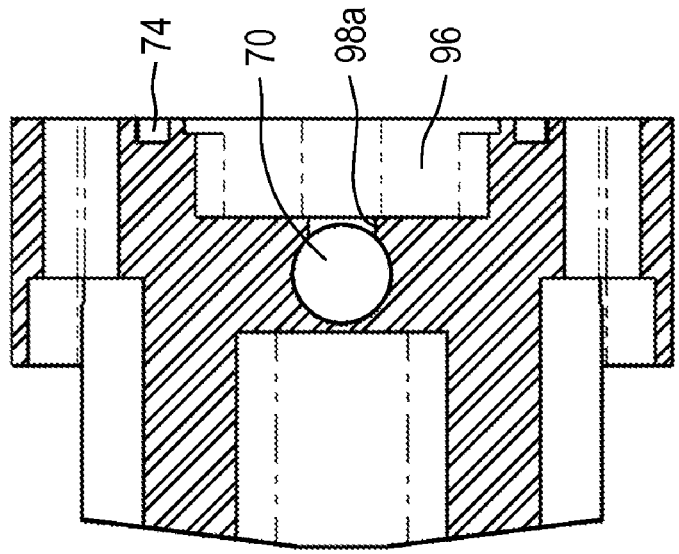
Figure 6A:
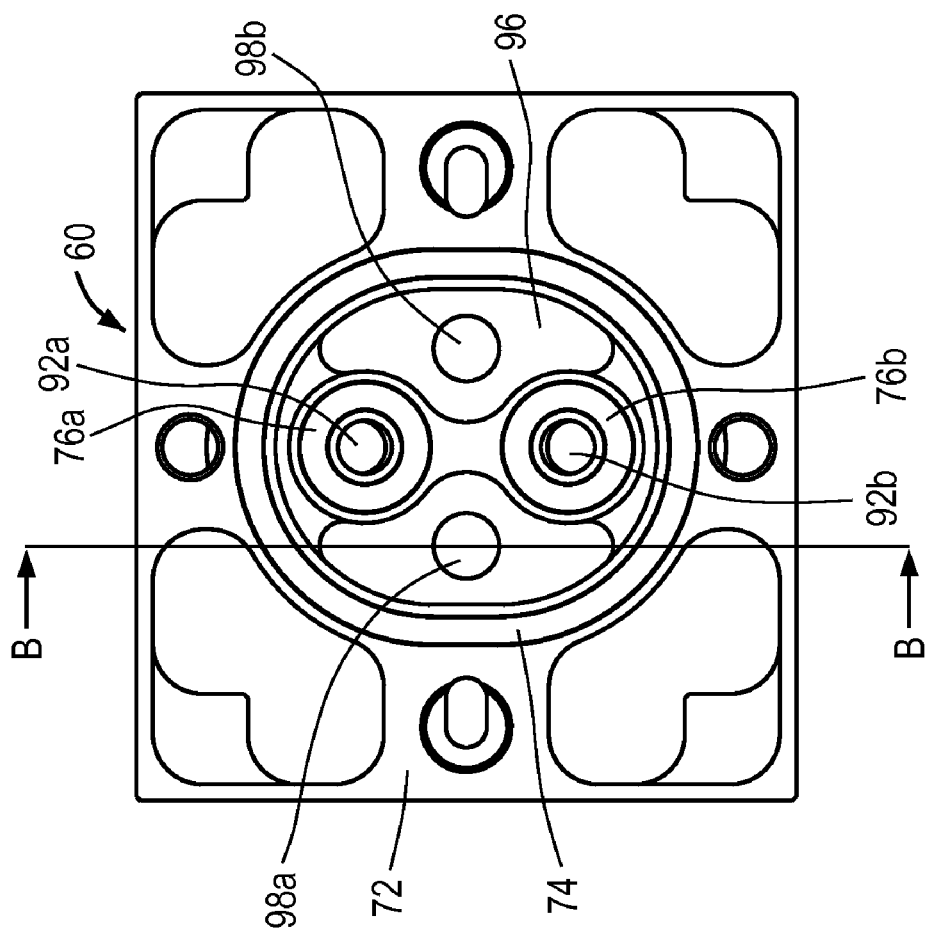
FIG. 6a is a plan view of a mounting face of the mounting block used in the wheel rim to mount a substrate holder.

A radially outwardly directed face of each mounting block 60 forms a substrate support mounting face 72 which is shown in plan view in FIG. 6a. A respective substrate support 26 comprises an arm 82 having a radially inwardly directed planar mounting face which registers and is secured by appropriate bolts (for example) to the mounting face 72 of the respective mounting block 60.

The end of the arm 82 of the substrate support 26, distal from the mounting block 60, carries a wafer holder 84 which supports, in use, a wafer 86. The arm 82 cants the wafer holder 84 at an angle of approximately 10° to the plane of the process wheel 14, again as may best be seen in FIG. 4. In the embodiment, the process wheel rotates in horizontal plane and centripetal force presses wafers 86 onto wafer holders 84 because of the aforementioned cant-angle.

An upper surface of each wafer holder 84, upon which the wafer 86 is mounted in use, is covered in an elastomeric thermally conductive material 88. Below the surface of the wafer holder there are formed a plurality of cooling channels 90. These channels 90 communicate, via internal fluid passages in the arm 82 of the substrate support 26, to the radially inwardly directed mounting face of the support 26. These cooling passages in the arm 82 register with respective passages 92a and 92b in the support mounting face 72 of the block 60. The internal passages within the arm 82 of the substrate support 26 can be seen in FIG. 5 at 94a and 94b where they pass through the section in FIG. 5 of the bifurcated fingers 82a and 82b of the arm 82. The ends of the passages in the arm 82, where they register with the passages 92a and 92b in the mounting block 60 can be seen in FIG. 4 at 93a and 93b.

Referring again to FIGS. 6a and 6b, the connections between the passages 93a, 93b in the arm 82 of the substrate support 26 and the passages 92a and 92b in the block 60, which in turn connect to the ends of the tubular spokes 24, are provided with a pair of seals in tandem. The inner seals comprise 'o' rings fitted in circular 'o' ring seats 76a and 76b in the mounting block 60. The outer seal for the connections to both channels 92a, 92b at the block 60 comprises a single larger 'o' ring in a race track shaped seat 74. Between the inner 'o' ring seals in seats 76a, 76b, and the single outer seal in the race track shaped seat 74, the mounting face 72 of the block 60 is formed with a depression 96 (best seen the sectional view of FIG. 6b) forming an intermediate chamber between the tandem seals. This intermediate chamber formed by the depression 96 is connected in the block 60 to the central plenum channel 70 by bores 98a, 98b (again best seen in the sectional view of FIG. 6b).

In operation of the implanter, the plenum channel 70 is independently evacuated, in order to provide a differentially pumped vacuum to the intermediate chambers 67 between the tandem seals between each spoke 24 and the mounting block 60, and also the intermediate chamber 96 between the tandem seals for the connection between the mounting block 60 and the arm 82 of the substrate support 26. The circumferential plenum channels 70, interconnected by the pipe sections 78, are connected to an independent vacuum pump 57 (FIG. 1) via three radial vacuum pipes 80 (best seen in FIG. 2) extending between the rim of the wheel and the hub 20. One such radial vacuum pipe 80 is also shown in FIG. 4 and this pipe 80 terminates at the wheel rim in a T junction 81 which interconnects into one of the pipe sections 78 between adjacent mounting blocks 60. In FIG. 4, the T junction 81 is shown separated from its neighboring mounting blocks for clarity. The radially inner ends of the vacuum pipes 80 are connected at the hub 20 to the vacuum pumping channels within the hub described previously. The vacuum channels within the hub 20 are connected by means well known in the art through rotary seals to the exterior of the process chamber 13 and to an auxiliary vacuum pump 57 (FIG. 1). Importantly, the pump 57 for differential pumping of the cooling fluid seals within the process chamber is separate from the vacuum pump or pumps (including pump 21 in FIG. 1) for evacuating the various chambers of the implanter.

More generally, the structure provides a number of detachable cooling fluid connections within the vacuum chamber, in particular the process chamber 10, of the implanter. Such detachable cooling fluid connections are provided (i) between the radially inner ends of each spoke 24, which act as cooling pipes, and cooling fluid passages 48 in the hub 20, (ii) between the radially outer ends of each spoke 24 and cooling fluid passages 92a, 92b in the mounting blocks 60, and (iii) between the passages 92a, 92b of each said mounting block 60 and the cooling fluid passages 93a, 93b in the arm 82 of the associated substrate support 26.

The cooling fluid passages 48 in the hub 20, the spokes 24, the passages 92a, 92b in the mounting blocks 60, and the passages 93a, 93b in the substrate support arms 82 are interconnected to provide fluid conduits to supply cooling fluid to and from cooling fluid channels 90 in the substrate support 26. It can be seen, therefore, that these cooling fluid conduits comprise series connected fluid conducting members, including the spokes 24 and the mounting blocks 60.

Each of the aforementioned detachable cooling fluid connections comprises first and second seals in tandem forming an intermediate chamber between them. For each of the connections between spokes 24 and the hub 20, the tandem seals are "o" rings in the "o" ring seats 51a, 51b forming the intermediate chamber 53. For each of the connections between spokes 24 and the mounting blocks 60, the tandem seals are "o" rings in the "o" ring seats 66a, 66b forming the intermediate chamber 67. For each of the connections between the passages 92a, 92b of the mounting blocks 60 and the passages 93a, 93b of the substrate support arm 82, the tandem seals are "o" rings in the respective inner "o" ring seats 76a, 76b and the larger "o" ring in the outer race track shaped "o" ring seat 74, forming the intermediate chamber (depression) 96.

The intermediate chambers are connected through the vacuum chamber wall to the exterior by a venting conduit. In the hub, this venting conduit comprises the channels 46 communicating with intermediate chambers 53 via passages 50.

In the rim, this venting conduit comprises the circumferential plenum channels 70 in the blocks 60, which are connected to the intermediate chambers 67 and (via passages 98a, 98b) to the intermediate chambers (depressions) 96. The venting conduit further comprises the interconnecting pipe sections 78 and vacuum pipes 80 extending radially from the rim to the hub 20 which are in turn connected at the hub, via channels in the hub, through rotary seals to the exterior of the vacuum chamber.

In the above described embodiment, the venting conduit is connected to independent vacuum pump 57 to maintain a vacuum in the intermediate chambers of the tandem seals, and ensure removal of any cooling fluid leakage before it can leak into the process chamber 10 of the vacuum chamber. It may not be necessary to vacuum pump the intermediate chambers, and in some embodiments it may be sufficient simply to use the venting conduit to vent the intermediate chambers to atmosphere. In another embodiment, duplicate venting conduits may be provided to enable a dry purging gas to be pumped through the intermediate chambers, thereby reducing the risk of cooling fluid (typically water) from leaking into the interior of the process chamber 10.

Referring again to FIG. 4, behind the substrate supports 26 mounted on their respective mounting blocks 60 around the periphery of the wheel there is a continuous annular baffle 99. This annual baffle collects any ion beam which bypasses the wafer holders 84 as the wheel rotates during the implanting process. In this way, the substantial power, a combination of relatively high current and high energy, of the beam is distributed around the annular baffle with consequent distribution of thermal energy from the absorbed beam.

As discussed previously, an important feature of this embodiment of the invention is that the scan wheel 14 rotates about an axis which is fixed, and the beam projected onto the wheel periphery to implant wafers moving through the implant position as the wheel spins, is a ribbon beam having a major dimension which is aligned radially with respect to the wheel axis and has a length which is equal to or greater than the radial extent of wafers mounted on the wafer supports at the wheel periphery. This ribbon beam can be regarded as fixed in the sense that the beam is not scanned to extend implant coverage over the substrate. However, a small amount of positional jitter may be introduced in the plane the ribbon beam in order to smooth out any small scale non-uniformities in the beam across the ribbon. Such jitter may be periodic with a period which is short compared to the duration of a total implant, and the spatial amplitude of the jitter is small compared to the length of the ribbon beam cross-section.

For practical purposes, the smallest wafer size likely to be useful in the desired process is at least a 100 mm in diameter (assuming a circular wafer). Non-circular wafers are also contemplated and these are available in the general form of a square or a square with rounded or clipped corners. In any case, if the greatest radial dimension of wafers mounted on the wheel periphery is 100 mm, then the major dimension of the ribbon beam in the radial direction must be in excess of 100 mm. Furthermore, it is desirable to ensure that the $H^+$ ions are implanted into the wafers uniformly over the wafer area, so that there is a dosage variation over the wafer which is preferably less than 10%. Greater uniformity can also be desirable in order to create a processing efficiency and to minimize the risk of damage to exfoliated laminae.

In order to provide a ribbon beam projected onto the wafers in the process chamber 10 which has a major cross-sectional dimension in excess of 100 mm, it is convenient to ensure that the beam extracted from the ion source 16 also is formed as a ribbon with a major dimension of comparable size.

Figure 7:
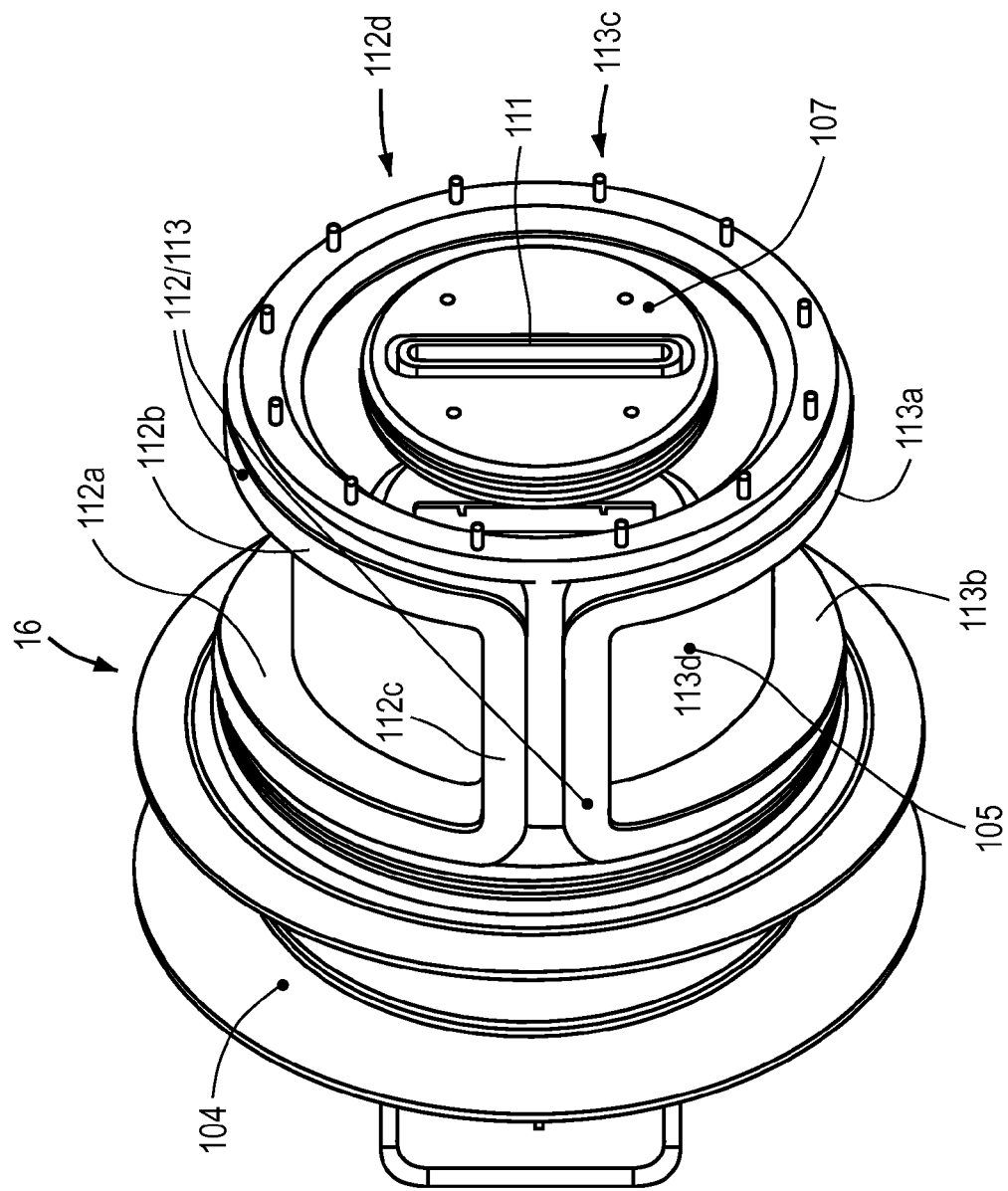
FIG. 7 is a perspective view of the ion source of the implanter.
Figure 8:
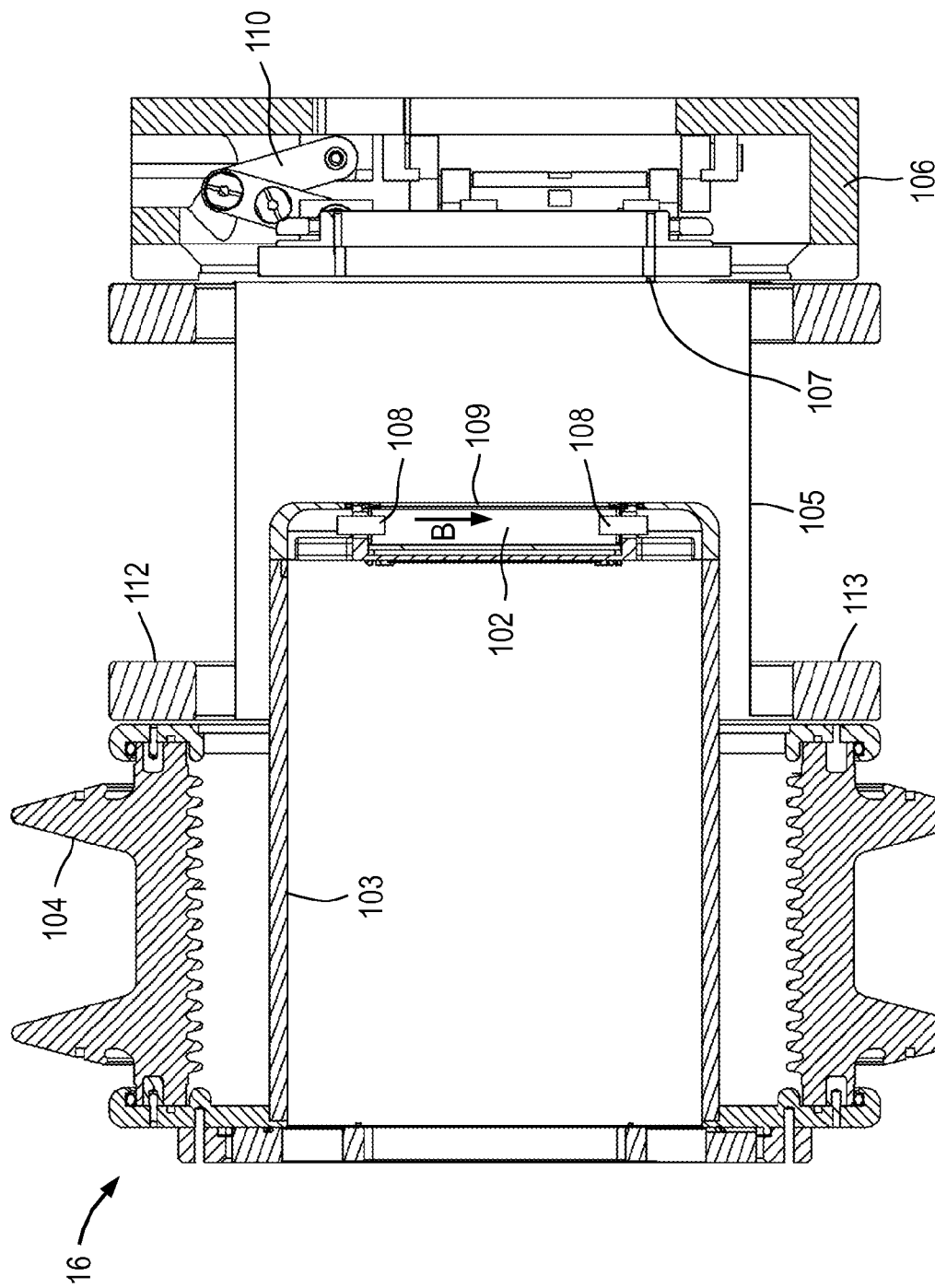
FIG. 8 is a schematic sectional view of the ion source of FIG. 7.

FIGS. 7 and 8 illustrate an embodiment of ion source which may form the ion source 16 of the ion implanter described herein. FIG. 8 is a sectional view of the ion source of FIG. 7, with the section taken along the beam axis of the ion source and in the plane of the extracted ribbon beam. Importantly, in FIG. 1, the beam 100 extracted from the ion source 16 is formed as a ribbon in the plane of the paper, so that the magnetic filter structure 17 in FIG. 1 bends this beam substantially through a right-angle, also in the plane of the paper, that is to say in the ribbon beam plane. Then the resulting ribbon beam 101, now containing only desired $H^+$ ions, emerging from the magnetic filter 17 has its major dimension aligned radially with respect to the rotational axis of the wheel 14 as desired.

The structure of the ion source illustrated in FIGS. 7 and 8 will be, in many respects, known to those familiar with this art. An arc chamber 102 is mounted at one end of a mounting cylinder 103, which is in turn mounted to a left hand end (in FIG. 8) of an insulting bushing 104. The right end of the cylindrical insulting bushing 104 is connected to a cylindrical element 105, which forms part of the vacuum chamber of the device. The cylindrical element 105 supports at its right hand end an arrangement 106 for moveably supporting extraction electrodes 107. The extraction electrodes 107 are illustrated apparently "floating" in FIG. 7 for clarity. The cylindrical element 105 forms a first tubular part which may be made of non-ferromagnetic metal, and the insulating bushing 104 forms a second tubular part which is electrically insulating. The first and second tubular parts are connected end to end and the arc chamber 102 is mounted on an end of the second tubular part remote from said metal first tubular part.

In operation, a low pressure arc discharge is formed within the arc chamber 102 of the ion source, by applying an arc voltage between the body of the arc chamber 102 and opposed cathodes 108. The cathodes 108 are biased negatively with respect to the body of the arc chamber and arranged to emit electrons into the interior of the arc chamber which are then accelerated by the bias voltage. The cathodes 108 are typically heated to provide thermionic emission of electrons and the heating may be either direct or indirect in accordance with known art.

A gas containing atoms of the species desired to implanted is introduced into the arc chamber 102 by a conduit which is not shown in FIG. 8. In this embodiment, this gas is hydrogen. The energetic electrons emitted by the cathodes 108 interact with molecules of the hydrogen gas, to produce a plasma containing $H^+$ ions.

A front wall, on the right in FIG. 8, extends along a linear dimension of the arc chamber 102 and contains an extraction slit 109 aligned with said linear dimension, through which desired $H^+$ ions can be extracted from the ion source to form the desired ion beam. The cathodes 108 are located facing each other along said linear dimension and provide a plasma space between them which extends over the full length of the extraction slit 109. To operate the ion source, the extraction electrodes 107 are transferred, by operating the linkages 110, to the left in FIG. 8 to be proximate to the front face of the arc chamber outside the slit 109. The body of the arc chamber 102 is biased positively relative to the extraction electrodes 107, to provide an electric field between the extraction electrodes 107 and plasma within the arc chamber 102, which draws positive ions from the arc chamber out through the slit 109 and through corresponding slits in the electrodes 107 to form the desired ion beam.

Importantly, in this embodiment, the extraction slit 109 of the ion source is relatively long in the plane of the paper of FIG. 8, substantially matching the dimensions of the slits 111 (FIG. 7) in the extraction electrodes 107, in order that the beam extracted from the ion source has the desired shape as a ribbon beam with a major dimension, in the plane of the paper of FIG. 8, of at least 100 mm, and sufficient to extend over the full width of wafers to be implanted.

It is normal practice for an ion source of the type described, to apply a magnetic field extending along said linear dimension within the arc chamber 102 in a plane containing the extraction slit 109, and between the opposed cathodes 108, in the direction of the arrow marked B in FIG. 8. The magnetic field B in the arc chamber 102 tends to confine electronics being accelerated from the cathodes 108 to a region along the line between the two cathodes, because the electrons are forced to spiral around the flux lines of the magnetic field. In this way, the desired plasma in the arc chamber 102 is produced more efficiently and is also confined by the magnetic field to this linear region, immediately in front of the extraction slit 109 in the front face of the chamber.

In the present embodiment, the magnetic field B within the arc chamber 102 is produced by a pair of saddle coils 112, 113 located outside and around the cylindrical element 105 and surrounding the arc chamber 102. The saddle coils 112 and 113, are arranged symmetrically on either side of a plane normal to and bisecting the line joining the cathodes 108, and also normal to and bisecting the extraction slit 109 of the arc chamber 102. The saddle coil 112 comprises opposed semi-circular portions 112a and 112b interconnected by axial portions 112c and 112d (which latter is not visible in FIG. 7). The second saddle coil 113 is similarly formed of semi-circular portions 113a and 113b interconnected by axial portions 113c and 113d. The two coil sections 112, 113 are connected in series to produce a homogenous magnetic field across the arc chamber 102 aligned in the direction of the arrow B in FIG. 8. Importantly, no ferromagnetic core is used with the saddle coils.

Figure 9:
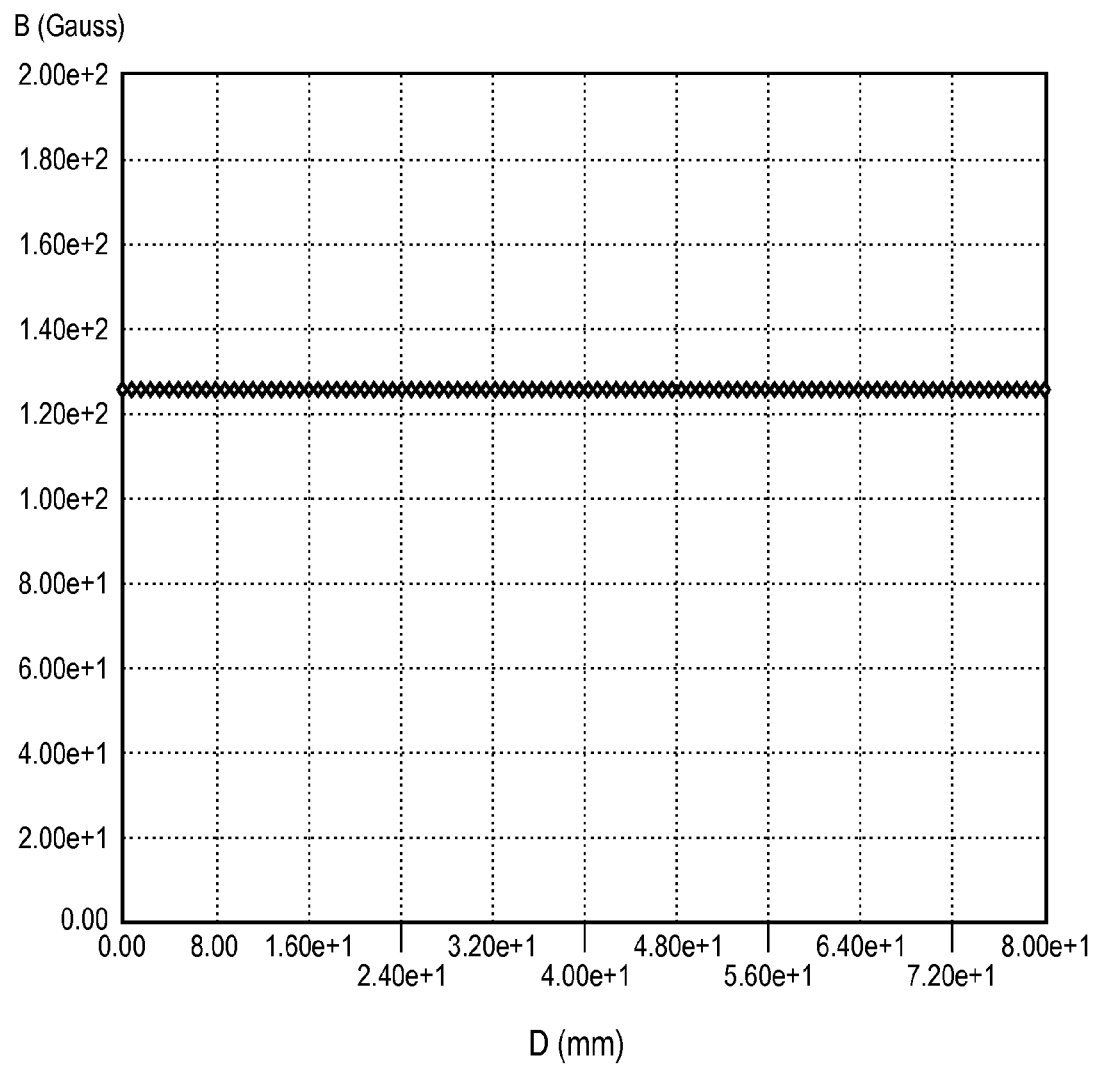
FIG. 9 is a plot of magnetic field strength against distance from a center line of the arc chamber of the ion source in the plane of the extraction slit of the source.

Saddle coil structures of this kind are known to provide a substantial region of homogeneity of a magnetic field within the space encompassed by the coils. Importantly, a magnetic field produced by the saddle coils 112, 113 can be uniform over a substantial distance in the magnetic field direction, so that the field within the arc chamber can be very uniform over the full height of the arc chamber between the opposed cathodes 108. FIG. 9 is a plot of magnetic field strength B against distance D from the center line of the extracted beam, i.e. half way between the cathodes 108 within the arc chamber 102. A field variation from 125.6 Gauss at the center point (on the beam axis) to 126.4 Gauss at a distance of 75 mm off axis is illustrated, constituting a variation of less than 1%. By providing this very uniform field within the arc chamber over the full length of the extraction slit 109, uniform plasma conditions can be provided also over the full length of the slit, so that the extracted ribbon beam can have a uniform intensity over the full width of its major dimension.

More generally, a magnetic field device is required to provide said magnetic field in the arc chamber having a flux density which has a non-uniformity less than 5% along said linear dimension over the length of the extraction slit.

In the described embodiment, the cylindrical element 105 is made of stainless steel and is permeable to magnetic field. The length of the slit 109 may be 160 mm to produce a ribbon beam of that major dimension. The ion source may be biased at 100 keV relative to the cylindrical element 105 and the final element of the extraction electrode combination, so that the ribbon beam delivered from the source towards the magnetic filter 17 is 100 keV.

The magnetic field strength or flux density required within the arc chamber for good performance may be equal to or less than 500 Gauss, and in embodiments may be between 200 and 300 Gauss. The electric power needed to produce such a field using the saddle coils disclosed is in the order of 500 watts.

It has been mentioned previously herein that the ribbon beam reaching the wafers on the process wheel 14 should provide a uniform dose to the implanted wafers in the radial direction relative to the axis of rotation of the wheel 14. In order to exfoliate films of silicon, $H^+$ ions should be implanted with a dose, for example, of 5E16 ($5\times10^{16}$/cm$^2$). Although the requirements for dosing and uniformity for exfoliation are not as severe as in the production of semiconductor devices, a uniform dose is desirable not only to ensure good exfoliation performance without damage, but also to maximize production efficiency.

It will be appreciated that the speed at which the different parts of a wafer mounted on the process wheel 14 passes through the ribbon beam is proportional to the radial distance (R) from the rotation axis of the wheel (see FIG. 4). As a result, the dose implanted to a wafer using a ribbon beam which has a perfectly uniform intensity across the major dimension of the ribbon (which extends radially relative to the wheel) will vary with 1/R. To compensate for this, in one embodiment, the ribbon beam is modified to have an intensity gradient along the major dimension of the ribbon which is proportional to R. In the embodiment, this is achieved by adapting the design of the magnetic filter 17.

Figure 10:
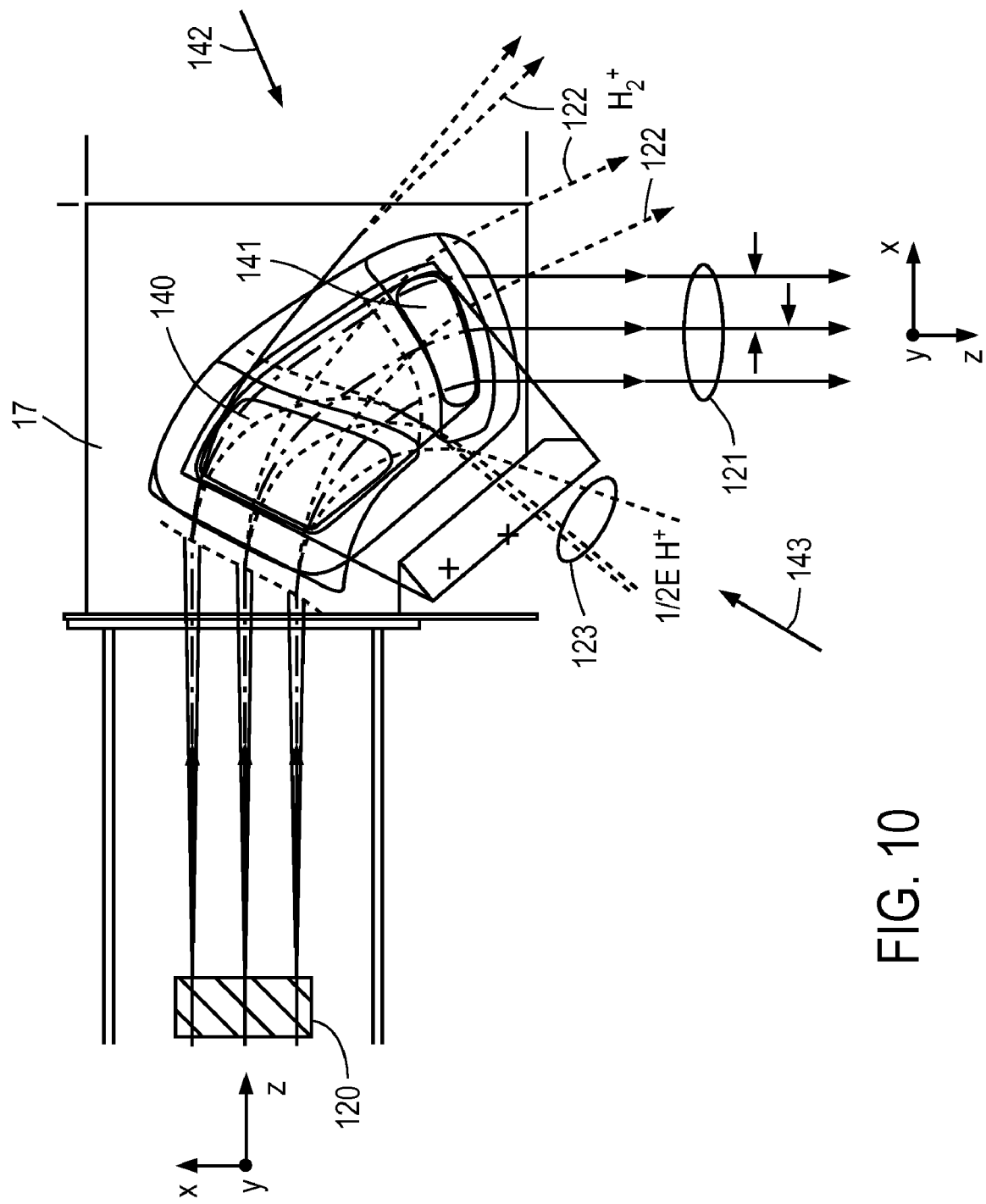
FIG. 10 is a schematic view of the magnet structure used for bending the ribbon beam in the ion implanter.

As mentioned previously, this magnet is arranged to bend the ribbon beam in the plane of the ribbon. The magnet 17 is designed to receive a ribbon beam of the desired width directly from the source and to deliver a ribbon beam of substantially the same width, but containing only $H^+$ ions (in this embodiment) towards the accelerator column 18 for subsequent implantation. This functionality can be seen from the schematic drawing of FIG. 10. Conventionally, a ribbon shaped ion beam is defined in Cartesian co-ordinates x, y, z, where x is the major cross-sectional dimension of the ribbon beam, y is the minor cross-sectional dimension of the beam, and z is the direction of the beam. In FIG. 10, a ribbon beam of the desired dimension in x is produced by an ion source 120 and enters magnet structure 17. The beam is substantially parallel across the x-dimension. In the magnet structure, the ribbon beam is bent through about 90° in the plane of the ribbon and emerges as a parallel ribbon beam 121 having substantially the same width (in x) as the beam originally extracted from the ion source.

The magnet structure 17 provides regions of magnetic field across the ribbon beam in the y direction. The magnetic field is homogeneous right across the x direction of the ribbon. As is known to those skilled in the art, charge particles moving in such a field, show a curved path with a radius which is a function of momentum and charge (mv/e). Magnet structures of this general kind are used in ion implantation tools to filter ion beams extracted from an ion source in order to prevent all except a desired species of ion reaching the wafer for implantation. When implanting dopants in the structuring of silicon to produce electronic devices, relatively high resolution may be required of the magnetic filter, in order to distinguish the desired dopant ions from others in the extracted beam having very similar values of mv/e. In such magnetic filters, a narrow mass selection slit is commonly used at the exit of the magnetic filter in order to provide the required mass resolution. It is then important that the magnetic filter acts to bring ions of the same mv/e effectively to a focus in the bending plane of the magnet at the exit of the filter where the mass selection slit can be located to provide good resolution.

By comparison, the magnetic structure 17 in the present embodiment does not attempt to bring ions of the same mv/e to a focus in the x direction, but indeed retains the full width of the ribbon beam on exit from the filter. This can provide satisfactory mass resolution in the particular application of this embodiment, because the desired ion for implantation is typically $H^+$. Contaminant ions in the beam extracted from the ion source 120 all have much higher masses which are a multiple of the mass of the hydrogen ion and so can easily be discriminated. In fact likely contaminants in the ion beam will barely be deflected by the magnetic structure 17.

The challenge for the magnetic structure 17 is to ensure elimination from the beam delivered for implantation of other hydrogen ions in the beam, particularly $H_2^+$, and also half energy $H^+$ ions. The plasma in the ion source 120 formed from hydrogen gas will typically contain both $H^+$ and $H_2^+$ ions (as well as some larger molecular hydrogen ions). $H_2^+$ ions having twice the mass of $H^+$ ions would tend to follow paths such as indicated by the dotted lines 122 in FIG. 10. Half energy $H^+$ ions are produced by dissociation or breakdown of $H_2^+$ ions after being accelerated from the ion source 120 and before or entering the magnetic structure 17. These half energy ions may follow tracks as illustrated by the dotted lines 123 in FIG. 10.

The magnetic structure 17 in the present embodiment is required as explained above only to discriminate essentially between ions with mv/e which are a factor of $\sqrt{2}$ or more, higher or lower, than the desired $H^+$ ions. Because the bending magnet is arranged to retain the ribbon beam and bend the beam in the plane of the ribbon, a substantial overall amount of bend is required to ensure even this level of resolution. The overall bend applied to the ribbon beam by the magnetic structure 17 should be at least 75° and is 90° in this embodiment. A smaller bend will require a longer flight path for the beam between exiting the magnetic structure and entering the accelerator column 18.

Figure 11:
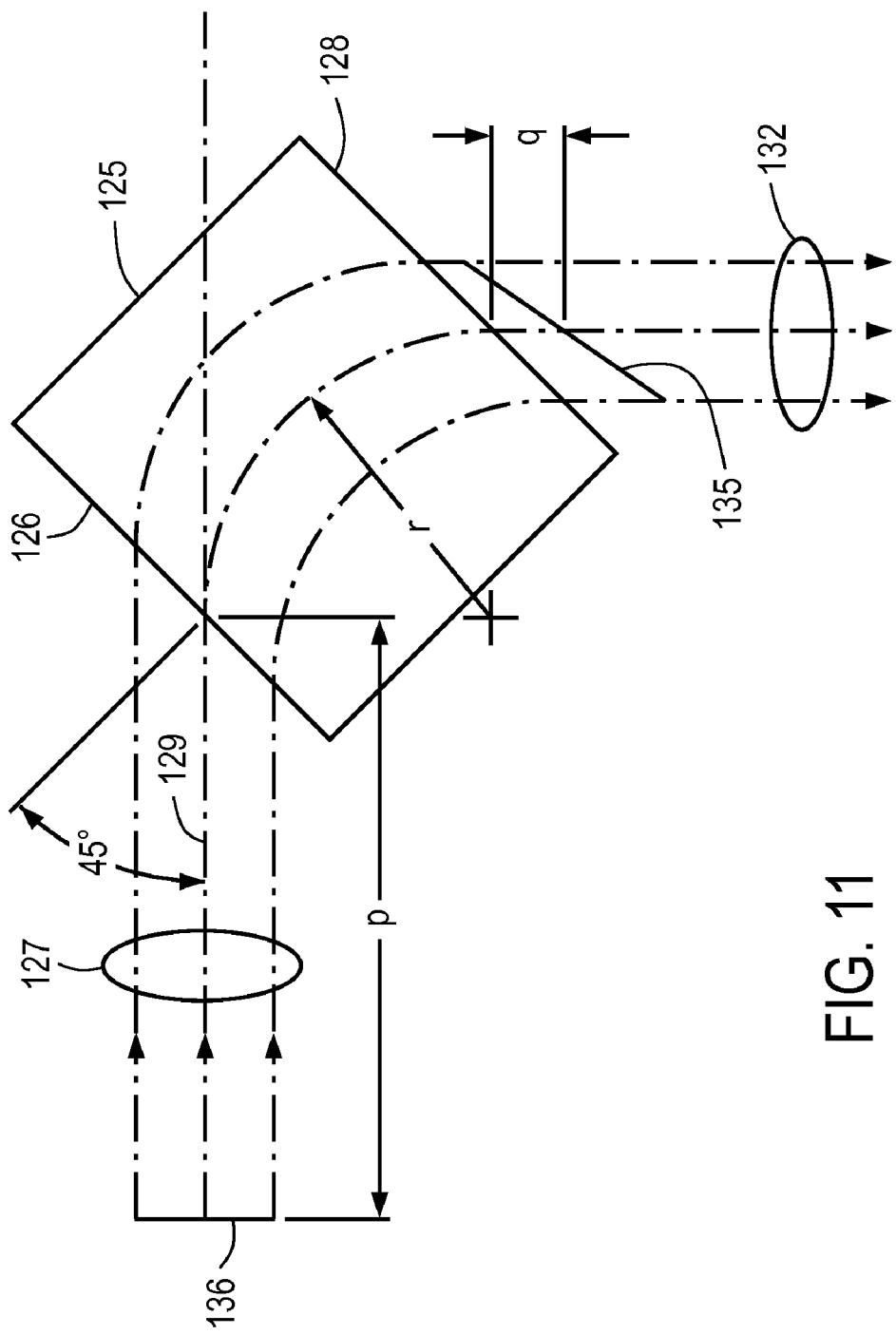
FIGS. 11, 12 and 13 are schematic diagrams illustrating the effect of the edges of the homogeneous magnetic field region within the bending magnet of an ion implanter.

Referring now to FIG. 11, this is a schematic representation of the shape of the homogeneous magnetic field in the magnet structure 17, and its effect on the ribbon beam. A single region 125 of homogeneous magnetic field is illustrated having a linear edge 126 at the entrance for the ribbon beam 127, which is arranged at 45° to the input beam direction. The field region has an exit edge 128 which is parallel to the entrance edge 126. If the field strength within the region 125 is set in relation to the mv/e value of the desired ions in the incoming beam, so that the central incoming beamlet 129 bends through 90° in the magnetic field region 125, then the exit edge 128 will also form an angle of 45° to the leaving beam 130. Beam ions with the desired mv/e value will follow circular paths within the homogeneous magnetic field region 125 having radius r, and it can be seen that, in the x dimension of the beam (as defined above) the ribbon beam will have the same major dimension on exit as on entry, and the beamlets across the ribbon of the exit beam 130 are parallel (in the xz plane), assuming the beamlets of the entrance beam 127 are parallel in the xz plane. Importantly also, the intensity distribution of the beam across the x direction is unchanged.

If the normal to the entrance field edge 126 is at an angle α (rather than 45° as illustrated in FIG. 11) to the incoming beam, an incoming ribbon beam of width 2*d* emerges from the magnet at the exit edge 128 with a width 2*d* tan α. For example, if the entrance edge 126 is at 55°, the ribbon width is expanded at the exit by 42%.

Figure 12:
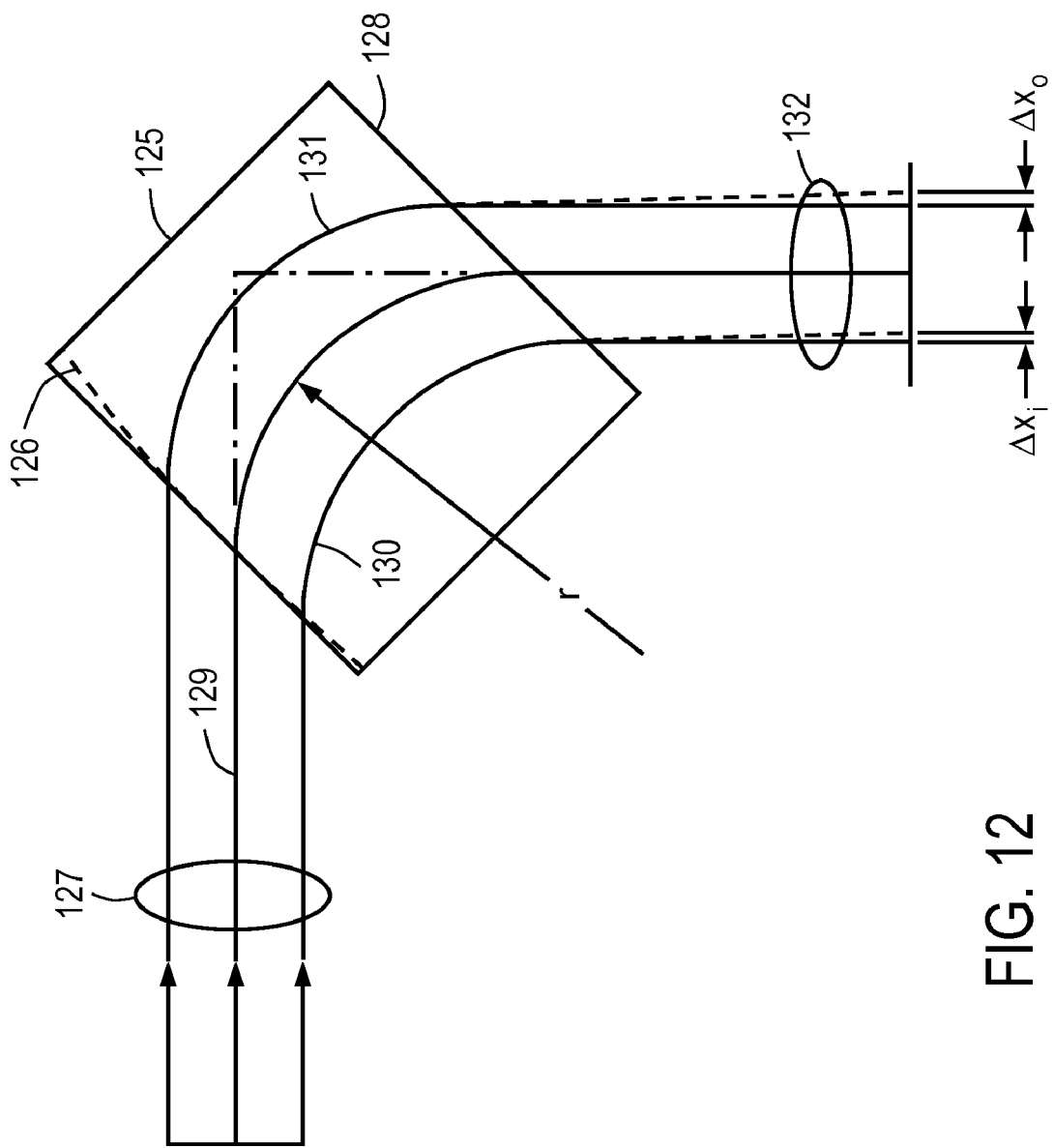
Figure 13:
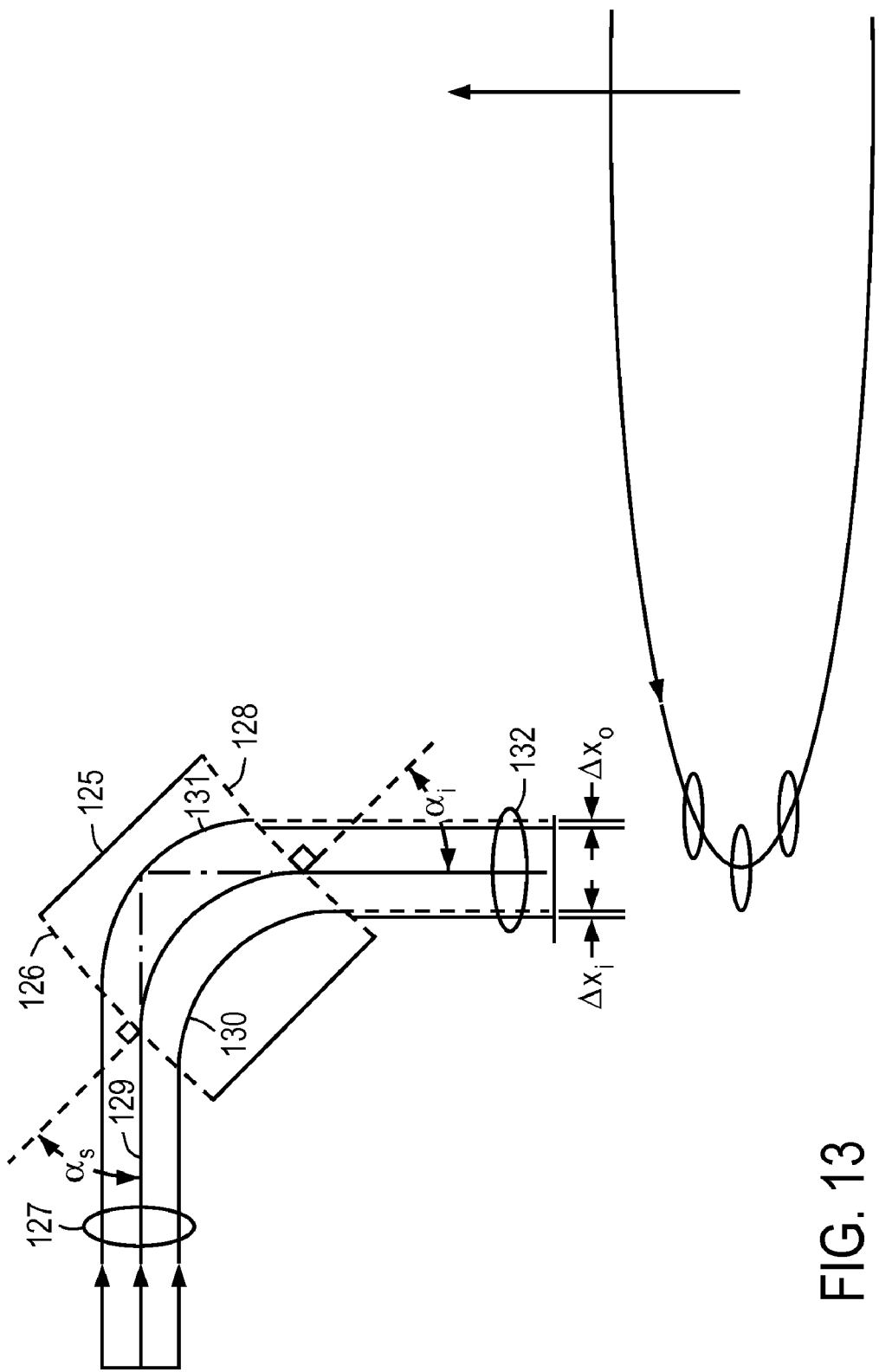

FIG. 12 shows the effect of forming the entrance edge 126 with a convex curvature, the dashed line in FIG. 12. If the edge 126 is still at 45° to the central beamlet 129 of the incoming beam, this beam emerges through the exit edge 128 unaffected by the curvature of the entrance edge 126. However, the radially inner beamlet 130 emerges from the edge 128 displaced towards the central beamlet 129 by an amount $\Delta x_i$, and the radially outer beamlet 131 emerges at edge 128 displaced away from the central beamlet by an approximately similar amount $\Delta x_o$. This is illustrated in FIG. 12 by the dashed lines in the output beam 132. Apart from the small displacement of the inner and outer beamlets 130 and 131 at the exit field edge 128, the direction of these beamlets is at a small angle to the central beamlet 129. It can be seen in fact that each of the inner and outer beamlets 130 and 131 has traveled a slightly shorter distance within the homogeneous magnetic field region 125 compared to the central beamlet 129, and so they are bent slightly less than 90°. If a concave curvature is applied to the exit field edge 128, as shown in FIG. 13, this deviation of the emerging angle of the inner and outer beamlets 130 and 131 can be corrected, so that the beamlets of the emerging ribbon beam are again parallel. However, there remains a displacement of the radially inner beamlet 130 towards the center beamlet 129, and of the radially outer beamlet 131 away from the central beamlet 129. The effect of this displacement of the beamlets in the ribbon beam passing through the magnetic field region 125 can be to apply a variation in beam intensity across the x direction of the ribbon beam exiting from the magnet. It can be seen from FIG. 13 that the beamlets on the left of the center line of the emerging beam 130 are slightly compressed in FIG. 13, and beamlets to the right of the center beam are slightly expanded (in the x direction of the beam), so that the beam intensity on the inner left hand edge of the ribbon beam is increased relative to the beam intensity at the right hand edge of the emerging beam.

A ray departing from the source at a lateral position $x_s$, parallel to the input ribbon axes arrives at a position x in the image space. For the case of a simple bend with parallel entrance and exit pole edges 126 and 128 with normal to entrance pole edge 126 at an angle α to the input beam direction, x is proportional to $x_s$. Approximately, $x = x_s \tan \alpha$. For the case of α=45 deg, as shown in FIG. 11, $x = x_s$. Regardless of the value of α, the intensity is constant as a function of x—i.e.

$$I_0 = \frac{dN}{dx}, \qquad 1$$

where the quantity dN refers to the number of particles falling in a spatial distance dx.

If an adjustment in the magnetic bending field shifts the ray in image space to a new location $$\bar{x} = f(x), \qquad 2$$

the new intensity is $$I(\bar{x}) = \frac{dN}{d\bar{x}} = I_0 \bigg/ \frac{df}{dx} = I_0 \frac{dx}{d\bar{x}}. \qquad 3$$

If the new intensity distribution compensates for the target substrate rotating about an axis parallel to but displaced from the central axes of the output ribbon beam by an amount $R_0$, then necessarily, $$I(\bar{x}) = I_0 \left(1 - \frac{\bar{x}}{R_0}\right). \qquad 4$$

Combining equations 3 and 4 we arrive at the simple differential equation $$\frac{dx}{d\bar{x}} = 1 - \frac{\bar{x}}{R_0}. \qquad 5$$

Applying the boundary condition $\bar{x}=0$ when x=0, gives $$x = \bar{x} - \frac{\bar{x}^2}{2R_0}. \qquad 6$$

The solution of the quadratic equation for $\bar{x}$ is $$\bar{x} = R_0 \left(1 - \sqrt{1 - \frac{2x}{R_0}}\right). \qquad 7$$

Given $x \ll R_0$, it is instructive to expand the solution in powers of x as follows:

$$\bar{x} = x + \frac{R_0}{2}\left(\frac{x}{R_0}\right)^2 + \frac{R_0}{2}\left(\frac{x}{R_0}\right)^3 \ldots, \qquad 8$$

Thus, the displacement of a ray Δx from its unadjusted position x is $$\Delta x = \bar{x} - x = R_0\left\{\frac{1}{2}\left(\frac{x}{R_0}\right)^2 + \frac{1}{2}\left(\frac{x}{R_0}\right)^3 \ldots\right\}, \qquad 9$$

and the relative displacement $$\frac{\Delta x}{R_0}$$

varies approximately as the square of $$\frac{x}{R_0}.$$

Circular field edge curvatures are effective in providing radial intensity correction because they produce an adjustment to the relative ray position $$\frac{\Delta x}{R_0}$$

which happens to depend on the square of $$\frac{x}{R_0}.$$

Although FIG. 11 shows the homogeneous magnetic field region as having solid linear edges 126 and 128, in fact there will be fringing fields at these edges. The homogeneous field region 125 would be formed by correspondingly shaped magnetic poles located above and below the ribbon beam with a gap between them to accommodate the small dimension (y) of the beam passing between the poles. At the entrance and exit edges of the magnetic pole pieces, fringing fields would have field components above and below the median plane between the two poles, in the x direction, and it can be seen that the proportion of the x component of magnetic field in these fringing regions depends upon the angle α between the beam entering (or leaving) the field region and the normal to the pole edge.

Beam particles that enter the homogeneous field region above or below the median symmetry plane of the magnet experience a magnetic force in the y direction as they pass through the curved fringing field lines. Referring to FIG. 13, the entry angle of the beam relative to the normal to the homogeneous field edge is $\alpha_s$ and the exit angle is $\alpha_i$. For positive values of α in each case, the magnetic force on particles passing through the fringing fields is focusing, that is acting on the particles in a direction towards the median plane. This phenomenon is described quantitatively by H. A. Enge (Focusing of Charged Particles, Vol II, Ed. A. Septier, Academic Press, 1962, p 215). The ion optical focal length associated with the fringing field is given by $$f = \frac{r}{\tan\alpha},$$

where r is the bending radius of the particles in homogeneous field of the magnet and α is the rotation relative to the input (and output) beam direction, that is as illustrated in FIG. 13. For a particle diverging from the median plane of the beam at a distance p in front of the entrance field edge of the magnetic, the y focusing effect will cause the particle subsequently to cross the median plane at some distance q from the exit edge of the magnetic field. Distances p and q are illustrated in FIG. 11. The position of the input beam which is a distance p in front of the input field edge can be regarded as an optical line object in being the position from which particles begin to diverge from the median plane. The distance q can be regarded as the distance from the exit edge to a conjugate image of the input line object.

Figure 14:
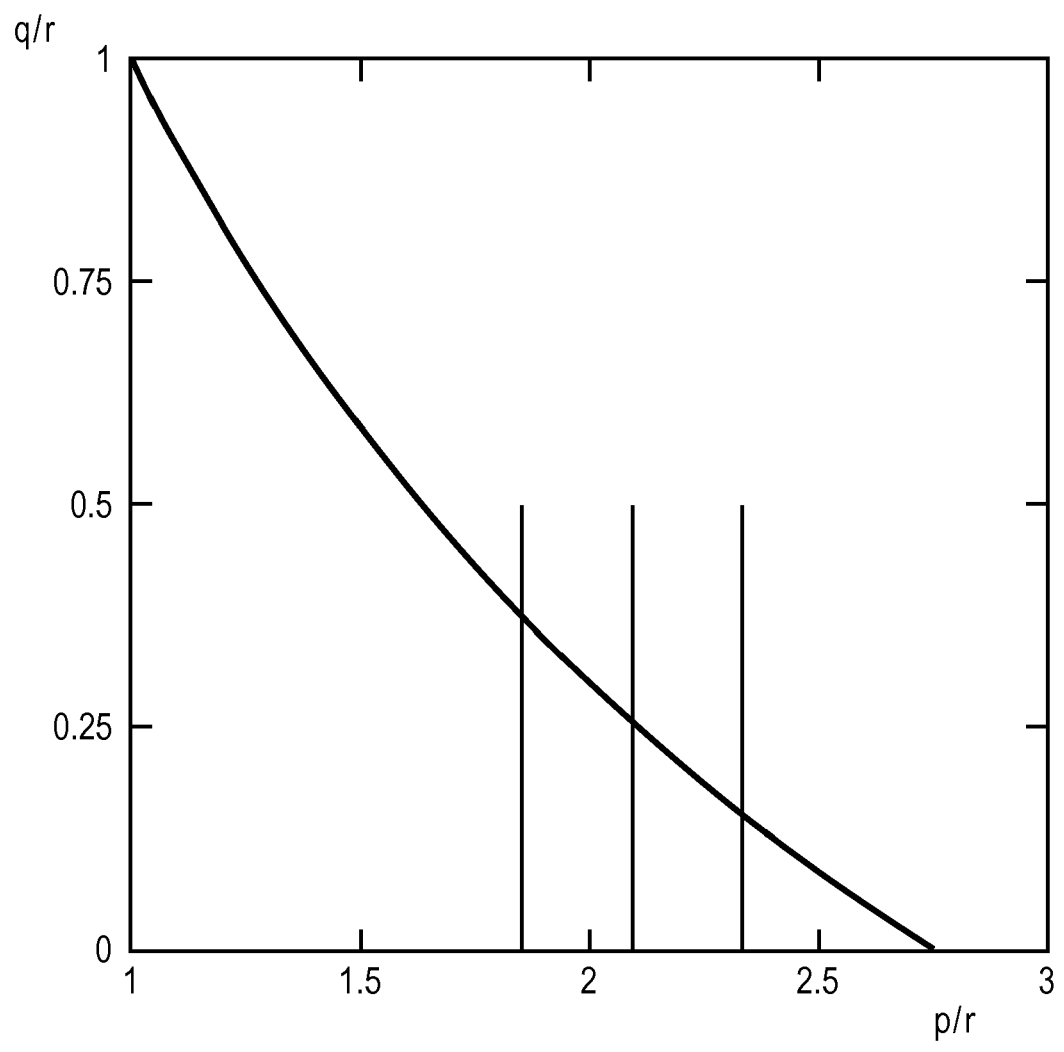
FIG. 14 is a graphical representation of the conjugate image distance versus the source/object distance for a typical bending magnet.

For the case of a 90° bend with both $\alpha_s$ and $\alpha_i$=45°, as shown in FIG. 11, a plot of q/r versus p/r is as shown in FIG. 14. The vertical lines in FIG. 14 correspond from left to right to the object distances for the radially innermost (relative to the bend radius r of the magnet), the center and the radially outermost beamlets of the ribbon beam, for a typical geometry where the source is located at a distance of approximately 2 r before the magnet. It should be noted (as shown in FIG. 11) that the image distances (q/r) for these three beamlets are quite different which results in a line 135 across the exiting ribbon beam representing the image of the source or object line 136 of the entry beam 127. As can be seen, this image line 135 is highly skewed relative to the direction of the exit beam 130.

Such a highly rotated y image plane is undesirable for the exit beam 130, where beam particles must travel some distance and also pass through an accelerator before reaching the target substrate.

The angle of the y image 135 in the exit beam 130 can be altered by changing the shape of the entrance and/or exit edges 126, 128 of the homogeneous field region. However, it is not possible to obtain both a desired intensity variation across the beam width, as described above, and a desired correction to the y image angle, with just a single entrance edge 126 and exit edge 128.

Referring again to FIG. 10, the magnet structure 17 is separated into two pole pairs 140 and 141. The construction of the magnet structure 17 can best be understood from FIGS. 15 and 16.

Figure 15:
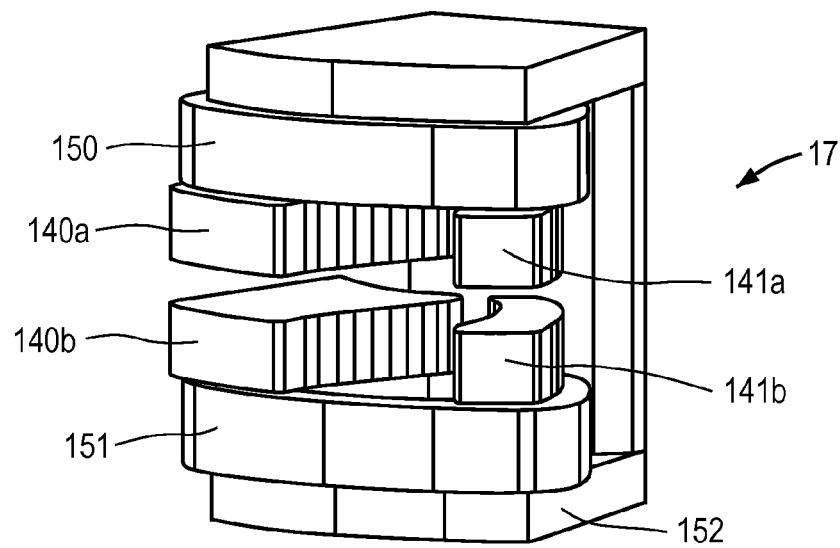
FIG. 15 is a perspective view of the magnet structure of the ion implanter.
Figure 16:
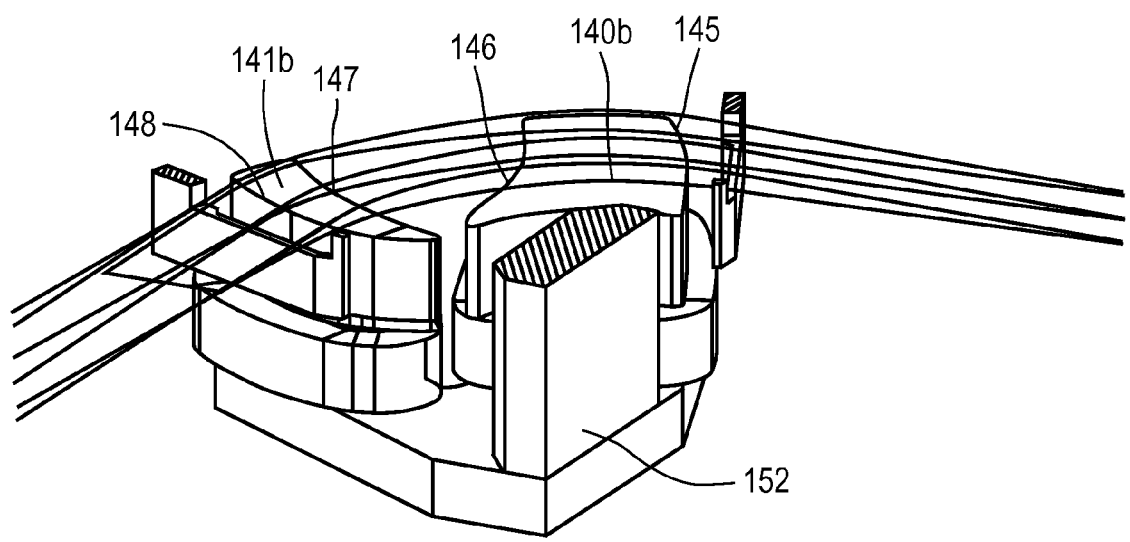
FIG. 16 is a further view of the magnet structure of FIG. 15, but with one set of poles removed for clarity.

FIG. 15 is a simplified perspective view of the magnet structure taken along a line 142 in FIG. 10, but from a position slightly beyond the plane of the paper of FIG. 10. FIG. 16 is a view taken along the direction of arrow 143 in FIG. 10, and again from slightly beyond the plane of the paper. In FIG. 16, an upper half of the magnet assembly has been removed to provide a clear view of the pole faces of the lower half of the structure. The magnet assembly comprises a first pair of opposing magnetic pole pieces 140a and 140b. The pole pieces 140a and 140b present pole faces of corresponding shape to each other with a spacing between them sufficient to accommodate the y dimension of the ribbon beam. Referring particularly to FIG. 16, the faces of pole pieces 140a and 140b present a convex entrance edge profile 145, and a concave exit edge profile 146. The magnet structure 17 further has a second pair of opposed pole pieces 141a and 141b. These second pole pieces are also shaped correspondingly, to provide a similar gap in the y direction to accommodate the ribbon beam. The faces of the second pole pieces 141a and 141b present a concave entrance edge profile 147 and a convex exit edge profile 148.

The magnet structure is energized by windings 150,151 on the opposing pole pieces, and the poles are magnetically interconnected by an iron yoke structure 152. Importantly, the windings 150,151 are arranged to ensure that the magnetic field between each pair of pole pieces 140a, 140b and 141a, 141b has the same polarity, to bend the ribbon beam in the same direction. Both of pole pieces 140a and 141a may be embraced by a common winding 150, and pole pieces 140b and 141b may be embraced by a common winding 151. However, separate windings may be provided on each individual pole piece either as well or instead of the common windings, if it is desired to independently control the field strength between each pair of pole pieces 140a, 140b, 141a, 141b. Separate windings also minimize the residual magnetic field in the region between the two poles.

By providing two sets of pole pieces, presenting a total of four homogeneous field edge profiles to the ribbon beam, additional degrees of freedom are provided for obtaining simultaneously both control of the intensity distribution in the x direction of the exit ribbon beam, and also correction of the y angle image plane to bring this towards a desired perpendicular direction across the exit beam 130.

In practice, the second pair of poles 141a, 141b are arranged to provide curved edges to the homogeneous field region such that some y-defocusing is applied to the radially outer beamlets of the ribbon beam. Defocusing in the y direction occurs if the angle between the beamlet approaching an entrance edge and the normal to the edge at that point is negative (angles $\alpha_s$ and $\alpha_i$ as shown in FIG. 13 being regarded as positive).

With the magnetic structure of FIGS. 15 and 16, a total beam bend of 90° is obtained with a first bend of 60° followed by a second bend of 30°. The pole edge shapes of the two pole pairs 140a, 140b, 141a, 141b are coordinated to achieve simultaneously a desired radial intensity variation to correct for the 1/R speed variation of wafers passing through the beam, and to produce a conjugate image line of the source slit in the exit beam from the magnet structure which is at a prescribed location at the entrance of the accelerator stack 18 and is substantially perpendicular to the ribbon beam direction. In this way the magnetic structure can focus an image of the source line near a y focusing plane of the accelerator stack 18 (see FIG. 1).

In order to determine the correct shape for the pole edges in the magnet structure, the pole edges can be described as mathematical polynomials of the fourth order (for example), or as cubic splines, and then determining the polynomial or spline coefficients by a standard mathematical optimisation technique, for example the cubic convergent method described by Donald A. Pierce (Optimization Theory With Applications, Doves Publications, Inc., 1986, pp 274-322).

In summary, the magnet structure 17 is designed to provide the following functionality:

a) to accommodate a ribbon beam of at least 100 mm major cross-sectional dimension and to bend the ribbon beam in the plane of the ribbon;
b) to provide a sufficient overall bend to the beam, to spatially resolve from desired beam ions, ions which have mv/e values a factor of $\sqrt{2}$ or more, higher or lower, than the desired ions. In one embodiment this resolution is achieved within the footprint of the magnet structure i.e. by the exit aperture plate of the magnet. However, it is important for this resolution to be achieved before the exit aperture of accelerator stack, in order to avoid unwanted ions from reaching the target substrate;
c) the pole pieces of the magnet structure are shaped to provide regions, at the edges of the homogeneous field regions, which are shaped to adjust the intensity of the exit ribbon beam, in the x direction, to provide dose compensation at wafers on the implant wheel for the dependence on wafer speed with radial distance R from the wheel axis; and
d) at the same time as c) above, the fringing field profiles within the magnet structure are adapted to bring the exit beam to focus in the y direction in a plane transverse to the exit beam which is substantially perpendicular to the beam, and at a location near to the input object focal point of the accelerator stack 18.

As described above, these objectives can be achieved by providing two pairs of poles in the magnet structure providing homogeneous magnetic fields of the same polarity across the plane of the ribbon beam, and having respective entrance and exit pole edges curved to provide the desired intensity variation and y focusing effect. Although two sets of poles have been disclosed, similar objectives could be achieved with more than two sets of poles, or by a single pole set with recessed pole faces in the in the region between the entrance and exit pole edges.

A variety of embodiments have been provided for clarity and completeness. Other embodiments of the invention will be apparent to one of ordinary skill in the art when informed by the present specification. Detailed methods of and systems for implantation have been described herein, but any other methods and systems can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention

The invention claimed is:

1. Ion implantation apparatus for performing an ion implantation process to implant ions into multiple planar workpieces, the apparatus comprising:
a workpiece support wheel mounted for rotation about an axis which is translationally fixed during a said implantation process, said support wheel having a plurality of workpiece supports distributed at a common radius around a periphery of said wheel; and
an ion beam generator which is arranged to form, during said implantation process, a non-scanning beam of ions for implanting, said beam being directed along a beam path to an implant location on said wheel periphery, whereby said workpieces on said supports are passed successively through said implant location along a circular scan path by rotation of said wheel, said workpieces each having a predetermined linear dimension in a plane of said workpiece, said predetermined linear dimension extending normal to said scan path when said workpieces are mounted on said supports, and said ion beam generator being adapted such that at said implant location, said beam of ions has a cross-sectional dimension normal to said scan path which is at least 100 mm and sufficient to implant ions over a full extent of said predetermined linear dimension of said workpieces on said supports.

2. Ion implantation apparatus as claimed in claim 1, wherein said ion beam generator is further adapted such that, at said implant location, said beam of ions has a pre-determined non-uniform intensity along said cross-sectional dimension, said pre-determined non-uniform intensity being proportional to R, where R is the radial position along said cross-sectional dimension relative to said axis of said support wheel.

3. Ion implantation apparatus as claimed in claim 1, wherein said ion beam generator includes an ion source having an ion extraction slit to generate a ribbon beam of ions including ions to be implanted, said ribbon beam having major and minor orthogonal cross-sectional dimensions, and a magnetic ion filter to bend said ribbon beam in a beam plane containing said beam and parallel to said major dimension so that said ions to be implanted are directed in said ribbon beam along said beam path towards said implant location.

4. Ion implantation apparatus as claimed in claim 3, wherein said magnetic ion filter is arranged to focus ions of said ribbon beam in the minor dimension of said ribbon beam to produce a conjugate ion optical image in said minor dimension of an ion optical object at said ion source, said conjugate image extending across said ribbon beam substantially perpendicularly to said beam path.

5. Ion implantation apparatus as claimed in claim 3, wherein said ribbon beam from said ion source which is input to said magnetic ion filter is substantially parallel over the major cross-sectional dimension of said ribbon and said magnetic ion filter is arranged such that an output beam from said magnetic ion filter is also substantially parallel over said major dimension of said ribbon.

6. Ion implantation apparatus as claimed in claim 5, wherein said magnetic ion filter is arranged to produce a bend in said ribbon beam between said input and output beams of at least 75°.

7. Ion implantation apparatus as claimed in claim 6, wherein said bend is about 90°.

8. Ion implantation apparatus as claimed in claim 5, wherein said magnetic ion filter comprises at least one region with homogeneous magnetic field normal to said beam plane, and provides a sufficient bend in said ribbon beam to spatially resolve from desired beam ions, non-desired ions having mv/e values a factor of or more, higher or lower, than said desired ions.

9. Ion implantation apparatus as claimed in claim 3, wherein said magnetic ion filter is arranged to redistribute ions over said major dimension of said ribbon beam to provide a predetermined non-uniform intensity of ions in said ribbon beam directed towards said implant location, said predetermined non-uniform intensity being proportional to R, where R is the radial position along said cross-sectional dimension relative to said axis of said support wheel.

10. Ion implantation apparatus as claimed in claim 4, wherein said magnetic ion filter is arranged to redistribute ions over said major dimension of said ribbon beam to provide a predetermined non-uniform intensity of ions in said ribbon beam directed towards said implant location, said predetermined non-uniform intensity being proportional to R, where R is the radial position along said cross-sectional dimension relative to said axis of said support wheel.

11. Ion implantation apparatus as claimed in claim 5, wherein said magnetic ion filter comprises:
an assembly having a flight tube defining an ion beam passage through said filter for desired ions, said beam passage having first and second cross-sectional dimensions extending respectively in first and second orthogonal directions, said first cross-sectional dimension being greater than said second cross-sectional dimension to accommodate a ribbon-shaped ion beam extending in a ribbon plane parallel to said first orthogonal direction; and
a magnet assembly to provide a magnetic field extending in said second direction across said beam passage to deflect ions in a ribbon beam passing through said flight tube in said ribbon plane;
wherein said magnet assembly has first and second pairs of opposed magnetic pole pieces spaced apart along said ion beam passage, said pairs providing respective magnetic fields with a common polarity across said beam passage, each of said first and second pairs of opposed pole pieces having, with respect to an ion beam direction through said beam passage, a respective predetermined leading edge profile and a respective predetermined trailing edge profile.

12. Ion implantation apparatus as claimed in claim 11, wherein said leading and trailing edge profiles of said first and second pairs of magnetic pole pieces are shaped to apply a predetermined redistribution of ions over said major dimension of said ribbon beam to provide a predetermined non-uniform intensity of ions in an output ribbon beam from said magnetic filter, said predetermined non-uniform intensity being proportional to R, where R is the radial position along said cross-sectional dimension relative to said axis of said support wheel.

13. Ion implantation apparatus as claimed in claim 12, wherein said leading and trailing edge profiles are further adapted to focus ions of said ribbon beam in the minor dimension of said ribbon beam to produce a conjugate ion optical image in said minor dimension of an ion optical object at said ion source, said conjugate image extending across said ribbon beam substantially perpendicularly to said beam path.

14. A magnetic ion filter assembly for ion implantation apparatus comprising:
a flight tube defining an ion beam passage through said filter for desired ions, said beam passage having first and second cross-sectional dimensions extending respectively in first and second orthogonal directions, said first cross-sectional dimension being greater than said second cross-sectional dimension to accommodate a ribbon-shaped ion beam having major and minor cross-sectional dimensions and extending in a ribbon plane parallel to said first orthogonal direction; and
a magnet assembly to provide a magnetic field extending in said second direction across said beam passage to deflect ions in a ribbon beam passing through said flight tube in said ribbon plane;
wherein said magnet assembly has first and second pairs of opposed magnetic pole pieces spaced apart along said ion beam passage and said pairs providing respective magnetic fields with a common polarity across said beam passage, each of said first and second pairs of opposed pole pieces having, with respect to an ion beam direction through said beam passage, a respective predetermined leading edge profile and a respective predetermined trailing edge profile.

15. A magnetic ion filter assembly for ion implantation apparatus as claimed in claim 14, wherein said leading and trailing edge profiles of said first and second pairs of magnetic pole pieces are curved and shaped to apply a predetermined redistribution of ions over said major dimension of said ribbon beam to provide a predetermined non uniform intensity of ions in an output ribbon beam from said magnetic filter.

16. A magnetic ion filter assembly for ion implantation apparatus as claimed in claim 15, wherein said leading and trailing edge profiles are further shaped to focus ions of said ribbon beam in the minor dimension of said ribbon beam to produce in an output ribbon beam from said magnetic filter a conjugate ion optical image in said minor dimension of a source ion optical object of ions in an input ribbon beam to said magnetic filter, said conjugate ion optical image extending substantially perpendicularly across said output ribbon beam.

17. A method of implanting ions into multiple planar workpieces comprising the steps of
  mounting said workpieces on workpiece supports distributed at a common radius around the periphery of a workpiece support wheel;
  rotating said support wheel around a translationally fixed axis whereby said workpieces are passed along a circular scan path successively through an implant location; and
  generating a non-scanning ribbon-shaped beam of ions to be implanted and directing said ribbon beam to said implant location so that a major cross-sectional dimension of said ribbon beam extends in a direction normal to said scan path completely across said workpieces passing through said implant location.

18. A method as claimed in claim 17, further including the step of providing a predetermined non-uniform intensity profile over said major cross-sectional dimension of said ribbon beam of ions at said implant location, said predetermined non-uniform intensity being proportional to R, where R is the radial position along said cross-sectional dimension relative to said axis of said support wheel.

19. A method as claimed in claim 17, wherein the step of generating a non-scanning ribbon-shaped beam comprises:
  extracting from an ion source said ribbon beam having major and minor orthogonal cross-sectional dimensions; and
    directing a magnetic filtering field in a magnetic filter across said ribbon beam from said ion source to bend said ribbon beam in a beam plane containing said beam parallel to said major dimension.

20. A method as claimed in claim 19, wherein said ribbon beam is extracted from said ion source so as to be substantially parallel over the major cross-sectional dimension of said beam, and said magnetic filtering field across said ribbon beam produces a filtered output ribbon beam which is also substantially parallel over the major cross-sectional dimension of said output beam.

21. A method as claimed in claim 20, wherein said magnetic filtering field bends said ribbon beam through at least 75°.

22. A method as claimed in claim 21, wherein said bend is about 90°.

23. A method as claimed in claim 20, wherein said magnetic filtering field comprises at least one region of homogeneous magnetic field normal to said beam plane and said ribbon beam is bent in said plane sufficiently to spatially resolve from said filtered output beam, non-desired ions having mv/e values a factor of 2 different from desired ions.

24. A method as claimed in claim 19, including the step of redistributing ions over said major dimension of said ribbon beam, by adapting said magnetic filtering field, to provide a predetermined non-uniform intensity of ions in said ribbon beam directed towards said implant location, said predetermined non-uniform intensity being proportional to R, where R is the radial position along said cross-sectional dimension relative to said axis of said support wheel.

25. A method as claimed in claim 24, wherein the step of directing a magnetic filtering field comprises
  directing a homogeneous magnetic field normal to said beam plane in a first field region having a first leading edge profile and a first trailing edge profile relative to said beam direction; and
  directing a homogeneous magnetic field normal to said beam plane in a second field region downstream in said beam direction from said first region, the field in said second region having the same polarity across said ribbon beam as the field in said first region and said second region having a second leading edge profile and a second trailing edge profile relative to said beam direction.

26. A method as claimed in claim 25, further including the step of shaping said first and second leading and trailing edge profiles to provide said redistribution of ions over said major dimension of said ribbon beam.

27. A method as claimed in claim 26, wherein said edge profiles are further shaped to focus ions of said ribbon beam in the minor dimension of said ribbon beam to produce in an output ribbon beam from said magnetic filter a conjugate ion optical image in said minor dimension of a source ion optical object of ions in an input ribbon beam to said magnetic filter, said conjugate ion optical image extending substantially perpendicularly across said output ribbon beam.

* * * * *